(12) United States Patent
Anderson et al.

(10) Patent No.: US 9,224,837 B2
(45) Date of Patent: Dec. 29, 2015

(54) SEMICONDUCTOR STRUCTURES WITH PAIR(S) OF VERTICAL FIELD EFFECT TRANSISTORS, EACH PAIR HAVING A SHARED SOURCE/DRAIN REGION AND METHODS OF FORMING THE STRUCTURES

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/711,069

(22) Filed: May 13, 2015

(65) Prior Publication Data
US 2015/0243765 A1  Aug. 27, 2015

Related U.S. Application Data

(62) Division of application No. 14/169,318, filed on Jan. 31, 2014, now Pat. No. 9,087,897.

(51) Int. Cl.
*H01L 29/72* (2006.01)
*H01L 29/66* (2006.01)
*H01L 29/78* (2006.01)
(Continued)

(52) U.S. Cl.
CPC ...... *H01L 29/66666* (2013.01); *H01L 21/3086* (2013.01); *H01L 21/823425* (2013.01); *H01L 29/42392* (2013.01); *H01L 29/66484* (2013.01);
(Continued)

(58) Field of Classification Search
CPC .................................. H01L 29/66666
USPC ............ 438/268, 586; 257/329; 365/189.011
See application file for complete search history.

(56) References Cited

U.S. PATENT DOCUMENTS 6,504,201 B1   1/2003  Noble et al.
7,479,672 B2   1/2009  Zhao
(Continued)

OTHER PUBLICATIONS

Kim, et al., "Three-Dimensional NAND Flash Architecture Design Based on Single-Crystalline Stacked Array," IEEE Transactions on Electron Devices, vol. 59, No. 1, Jan. 2012, pp. 35-45.
(Continued)

*Primary Examiner* — Edward Wojciechowicz
(74) *Attorney, Agent, or Firm* — Gibb & Riley, LLC; Michael J. LeStrange, Esq.

(57) ABSTRACT

Disclosed are semiconductor structures and methods of forming the structures. The structures each comprise a pair of vertical FETs. Specifically, a U-shaped semiconductor body has a horizontal section and two vertical sections. The horizontal section comprises a shared source/drain region for first and second vertical FETs. Each vertical section comprises a channel region and a source/drain region above the channel region for a corresponding one the vertical FETs. In one semiconductor structure, each vertical section has a gate wrapped around the channel region. In another semiconductor structure, each vertical section has a front gate positioned adjacent to the inner vertical surface at the channel region and a back gate positioned adjacent to the outer vertical surface at the channel region. In any case, a contact, which is electrically isolated from the gates, extends vertically to the shared source/drain region in the horizontal section. Optionally, metal strap(s) electrically connect the pair of vertical FETs to adjacent pair(s).

20 Claims, 17 Drawing Sheets

(51) Int. Cl.
    *H01L 21/308* (2006.01)
    *H01L 21/8234* (2006.01)
    *H01L 29/423* (2006.01)

(52) U.S. Cl.
    CPC ........ *H01L 29/7827* (2013.01); *H01L 29/7831* (2013.01)

(56) References Cited

U.S. PATENT DOCUMENTS

| | | | |
|---|---|---|---|
| 7,683,428 | B2 | 3/2010 | Chidambarrao et al. |
| 8,378,417 | B2 | 2/2013 | Ogawa et al. |
| 2010/0270611 | A1* | 10/2010 | Masuoka et al. ............. 257/329 |
| 2011/0002178 | A1 | 1/2011 | Hwang et al. |
| 2011/0188288 | A1 | 8/2011 | Minami |
| 2013/0043544 | A1 | 2/2013 | Erickson et al. |
| 2013/0100743 | A1 | 4/2013 | Lue |

OTHER PUBLICATIONS

Endo, et al., "A Dynamical Power-Management Demonstration Using Four-Terminal Separated-Gate FinFETs," IEEE Electron Device Letters, vol. 28, No. 5, May 2007, pp. 452-454.

U.S. Appl. No. 14/169,318, Restriction Requirement dated Oct. 24, 2014, 4 pages.

U.S. Appl. No. 14/169,318, Office Action Communication dated Jan. 20, 2015, 7 pages.

U.S. Appl. No. 14/169,318, Notice of Allowance dated Apr. 27, 2015, 5 pages.

* cited by examiner

SEMICONDUCTOR STRUCTURES WITH PAIR(S) OF VERTICAL FIELD EFFECT TRANSISTORS, EACH PAIR HAVING A SHARED SOURCE/DRAIN REGION AND METHODS OF FORMING THE STRUCTURES

CROSS-REFERENCE TO RELATED APPLICATIONS

The present invention claims the benefit under 35 U.S.C. §120 as a divisional of presently pending U.S. patent application Ser. No. 14/169,318 filed on Jan. 31, 2014, issued as U.S. Pat. No. 9,087,897 on Jul. 21, 2015, the entire teachings of which are incorporated herein by reference.

BACKGROUND

The present disclosure relates to semiconductor structures and methods and, more particularly, to semiconductor structures that comprise one or more pairs of vertical field effect transistors with each pair having a shared source/drain region and methods of forming such structures.

More particularly, integrated circuit design decisions are often driven by device scalability, manufacturing efficiency and costs. For example, size scaling of single-gate planar field effect transistors (FETs) resulted in devices with a smaller channel length. Unfortunately, the smaller channel length resulted in a corresponding increase in short channel effects and a decrease in drive current. In response, different types of multi-gate non-planar field effect transistors (MUGFETs), such as dual-gate non-planar FETs (also referred to herein as fin-type FETs (FINFETs)) and tri-gate non-planar FETs, which comprise one or more semiconductor fins, were developed in order to provide reduced-size field effect transistors, while simultaneously avoiding corresponding increases in short channel effects and decreases in drive current. Unfortunately, further size scaling of conventional MUGFETs has been limited by the required specifications for the different features of such devices. For example, a minimum gate length is required in order to switch a MUGFET on and off. This minimum gate length must, in turn, be considered in setting the pitch between source/drain contacts. Additionally, in MUGFETs that incorporate multiple semiconductor fins to increase transistor width and, thereby drive current, the pitch between semiconductor fins must be sufficiently large so as to allow for deposition of gate material between the semiconductor fins. Finally, the thickness of the semiconductor layer used to form the MUGFET must be equal to the height of the semiconductor fin(s). Therefore, there is a need in the art for a semiconductor structure and method of forming the structure that allows for further size scaling of FETs over what has heretofore been available with conventional planar FETs and MUGFETs.

SUMMARY

In view of the foregoing, disclosed herein are semiconductor structures configured to allow for continued size scaling of field effect transistors. The semiconductor structures each comprise a pair of vertical field effect transistors formed from an essentially U-shaped semiconductor body. This semiconductor body has a horizontal section and first and second vertical sections. The horizontal section can comprise a shared source/drain region for first and second vertical field effect transistors. The first and second vertical sections can each comprise a channel region and a source/drain region above the channel region for the first and second vertical field effect transistors, respectively. In one semiconductor structure, each vertical section has a gate wrapped around the channel region. In another semiconductor structure, each vertical section has a front gate positioned adjacent to the inner vertical surface at the channel region and a back gate positioned adjacent to the outer vertical surface at the channel region. In any case, a contact, which is electrically isolated from the gates, can extend vertically to the shared source/drain region in the horizontal section. Optionally, metal strap(s) can electrically connect the pair of vertical field effect transistors to adjacent pair(s) of vertical field effect transistors. Also disclosed herein are methods of forming such semiconductor structures.

More particularly, disclosed herein is a semiconductor structure comprising at least a pair of vertical field effect transistors formed from an essentially U-shaped semiconductor body. That is, the semiconductor structure can comprise a U-shaped semiconductor body. This U-shaped semiconductor body can comprise a horizontal section, a first vertical section and a second vertical section. The horizontal section can comprise a shared source/drain region for the pair of vertical field effect transistors. The first vertical section can extend vertically from a first end of the horizontal section and can comprise, for a first vertical field effect transistor in the pair, a first channel region and a first source/drain region above the first channel region. The second vertical section can be parallel to the first vertical section, can extend vertically from a second end of the horizontal section opposite the first end, and can comprise, for a second vertical field effect transistor in the pair, a second channel region and a second source/drain region above the second channel region.

The semiconductor structure can further comprise multiple gates. Specifically, the semiconductor structure can comprise a first gate for the first vertical field effect transistor adjacent to the first vertical section at the first channel region and a second gate for the second vertical field effect transistor adjacent to the second vertical section at the second channel region. In this semiconductor structure, the first gate and the second gate can comprise multi-layered spacers on vertical surfaces of the first and second vertical sections. Each multi-layered spacer can comprise a gate dielectric layer and a gate conductor layer positioned laterally adjacent to the gate dielectric layer. Optionally, the first gate can, for example, wrap entirely around the first vertical section at the first channel region and the second gate can, for example, wrap entirely around the second vertical section at the second channel region. A relatively thin layer of dielectric material on the top surface of the horizontal section can electrically isolate the first and second gates from the shared source/drain region contained therein.

The semiconductor structure can further comprise a shared source/drain region contact, which is positioned laterally between and electrically isolated from the first and second gates and which extends vertically to a center portion of the horizontal section (i.e., to the shared source/drain region). Additional source/drain contacts can extend vertically to the first and second source/drain regions at the top of the first and second vertical sections of the semiconductor body. Alternatively, metal strap(s) at the top of the first and/or second vertical sections can electrically connect the pair of vertical field effect transistors and, particularly, the first and/or second source/drain regions of the first and/or second vertical field effect transistors in the pair to adjacent pair(s) of vertical field effect transistors.

In the semiconductor structure described above, an exemplary configuration is discussed wherein the first and second gates wrap entirely around the first and second channel regions in the first and second vertical sections, respectively, of the semiconductor body. However, it should be understood that alternative gate configurations could be used. For example, in another semiconductor structure disclosed herein, discrete front and back gates can be positioned on opposing vertical surfaces of the first and second vertical sections of the semiconductor body.

Specifically, this semiconductor structure can similarly comprise a U-shaped semiconductor body. This semiconductor body can comprise a horizontal section, a first vertical section and a second vertical section. The horizontal section can comprise a shared source/drain region for the pair of vertical field effect transistors. The first vertical section can extend vertically from a first end of the horizontal section, can have first opposing vertical surfaces, and can comprise, for a first vertical field effect transistor in the pair, a first channel region and a first source/drain region above the first channel region. The second vertical section can be parallel to the first vertical section, can extend vertically from a second end of the horizontal section opposite the first end, can have second opposing vertical surfaces, and can comprise, for a second vertical field effect transistor in the pair, a second channel region and a second source/drain region above the second channel region.

The semiconductor structure can further comprise multiple gates. Specifically, the semiconductor structure can comprise first gates adjacent to the first opposing vertical surfaces of the first vertical section at the first channel region and second gates adjacent to the second opposing vertical surfaces of the second vertical section at the second channel region. The first gates can comprise a first front gate above the horizontal section and a first back gate opposite the first front gate. Similarly, the second gates can comprise a second front gate above the horizontal section and a second back gate opposite the second front gate. A relatively thin layer of dielectric material on the top surface of the horizontal section can electrically isolate the first and second front gates from the shared source/drain region contained therein.

The semiconductor structure can further comprise a shared source/drain region contact, which is positioned laterally between and electrically isolated from the first and second front gates and which extends vertically to a center portion of the horizontal section (i.e., to the shared source/drain region). Additional source/drain contacts can extend vertically to the first and second source/drain regions at the top of the first and second vertical sections of the semiconductor body. Alternatively, metal strap(s) at the top of the first and/or second vertical sections can electrically connect the pair of vertical field effect transistors and, particularly, the first and/or second source/drain regions of the first and/or second vertical field effect transistors in the pair to adjacent pair(s) of vertical field effect transistors.

Also disclosed herein are methods of forming such semiconductor structures. For example, one method of forming a semiconductor structure can comprise forming a pair of vertical field effect transistors. To form the pair, an essentially U-shaped semiconductor body can be formed such that it comprises a horizontal section, a first vertical section that extends vertically from a first end of the horizontal section and a second vertical section that is parallel to the first vertical section and that extends vertically from a second end of the horizontal section opposite the first end. For example, to form this semiconductor body, a mandrel can be formed on a semiconductor layer and sidewall spacers can be formed on opposing sidewalls of the mandrel. As a result, the semiconductor layer will have a masked portion, which is aligned below the mandrel and the sidewall spacers and which is positioned laterally between unmasked portions. The unmasked portions of the semiconductor layer can be removed and, then, the mandrel can be removed. Following removal of the mandrel, an exposed portion of the semiconductor layer between the sidewall spacers can be etched back, thereby forming the first vertical section, the second vertical section and the horizontal section between the first vertical section and the second vertical section.

After the semiconductor body is formed, the sidewall spacers can be removed and a dielectric material can be deposited over the semiconductor body. The dielectric material can be etched back to expose vertical surfaces of the first vertical section and the second vertical section without exposing the top surface of the horizontal section. That is, this etch back process can be performed such that the horizontal section between the first vertical section and the second vertical section remains covered by a relatively thin layer of the dielectric material.

Next, a first gate can be formed adjacent to the first vertical section and a second gate can be formed adjacent to the second vertical section. For example, the first and second gates can be formed such that each gate comprises a multi-layered spacer comprising a gate dielectric layer and a gate conductor layer positioned laterally adjacent to the gate dielectric layer. The first and second gates can further each be formed so as to wrap around the first vertical section and the second vertical section, respectively.

It should be noted that before and/or in between the above-described processes, various doping processes can be performed so that in the resulting semiconductor structure, the horizontal section comprises a shared source/drain region for the pair of vertical field effect transistors, so that the first vertical section comprises, for a first vertical field effect transistor of the pair, a first channel region and a first source/drain region above the first channel region, and so that the second vertical section comprises, for a second vertical field effect transistor of the pair, a second channel region and a second source/drain region above the second channel region.

Subsequently, contact(s) and, optionally, metal strap(s) can be formed. Specifically, a shared source/drain contact can be formed such that it is positioned laterally between and electrically isolated from the first and second gates and such that it extends vertically to the shared source/drain region for the pair of vertical field effect transistors at the center portion of the horizontal section of the semiconductor body. Additional source/drain contacts can also be formed that extend vertically to the first and second source/drain regions of the first and second vertical field effect transistors at the top of the first and second vertical sections of the semiconductor body. Alternatively, metal strap(s) can be formed at the top of the first and/or second vertical sections to electrically connect the pair of vertical field effect transistors and, particularly, the first and/or second source/drain regions of the first and/or second vertical field effect transistors in the pair to adjacent pair(s) of vertical field effect transistors.

In the method described above, exemplary process steps are discussed wherein the first and second gates are formed so as to wrap entirely around the first and second vertical sections, respectively, of the semiconductor body. However, it should be understood that alternative and/or additional process steps could be performed to achieve semiconductor structures with alternative gate configurations.

For example, another method disclosed herein similarly comprises forming a pair of vertical field effect transistors by forming an essentially U-shaped semiconductor body. In this case, a mandrel can be formed on a semiconductor layer and sidewall spacers can be formed on opposing sidewalls of the mandrel. As a result, the semiconductor layer will have a masked portion, which is aligned below the mandrel and the sidewall spacers and which is positioned laterally between unmasked portions. The unmasked portions can be removed and, then, a dielectric material can be deposited.

After the dielectric material is deposited, openings can be formed (e.g., patterned and etched) such that they extend vertically through the dielectric material and such that the masked portion is positioned laterally between the openings. These openings can then be filled with a conductor such that the masked portion will, as a result, be positioned laterally between a first back gate and a second back gate. Then, the mandrel can be removed and the exposed portion of the semiconductor layer between the sidewall spacers can be etched back to form the essentially U-shaped semiconductor body, which comprises a horizontal section, a first vertical section extending vertically from a first end of the horizontal section and having first opposing vertical surfaces, and a second vertical section parallel to the first vertical section, extending vertically from a second end of the horizontal section opposite the first end, and having second opposing vertical surfaces.

After the semiconductor body is formed, the sidewall spacers can be removed and an additional dielectric material can be deposited over the semiconductor body. The additional dielectric material between the first vertical section and the second vertical section can then be etched back to expose a first vertical surface of the first vertical section and a second vertical surface of the second vertical section without exposing the horizontal section. That is, this etch back process can be performed such that the inner vertical surfaces of the first and second vertical sections of the semiconductor body are exposed and further such that the horizontal section between the first vertical section and the second vertical section remains covered by a relatively thin layer of the additional dielectric material.

Next, front gates can be formed adjacent to the exposed inner vertical surfaces of the first and second vertical sections. Specifically, a first front gate can be formed adjacent to the first vertical surface of the first vertical section opposite the first back gate and a second front gate can be formed adjacent to the second vertical surface of the second vertical section opposite the second back gate.

It should be noted that before and/or in between the above-described processes, various doping processes can be performed so that in the resulting semiconductor structure, the horizontal section comprises a shared source/drain region for a pair of vertical field effect transistors, so that the first vertical section comprises, for a first vertical field effect transistor of the pair, a first channel region and a first source/drain region above the first channel region, and so that the second vertical section comprises, for a second vertical field effect transistor of the pair, a second channel region and a second source/drain region above the second channel region.

Subsequently, contact(s) and, optionally, metal strap(s) can be formed. Specifically, a shared source/drain contact can be formed such that it is positioned laterally between and electrically isolated from the first and second gates and such that it extends vertically to the shared source/drain region for the pair of vertical field effect transistors at the center portion of the horizontal section of the semiconductor body. Additional source/drain contacts can also be formed that extend vertically to the first and second source/drain regions of the first and second vertical field effect transistors at the top of the first and second vertical sections of the semiconductor body. Alternatively, metal strap(s) can be formed at the top of the first and/or second vertical sections to electrically connect the pair of vertical field effect transistors and, particularly, the first and/or second source/drain regions of the first and/or second vertical field effect transistors in the pair to adjacent pair(s) of vertical field effect transistors.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1A:
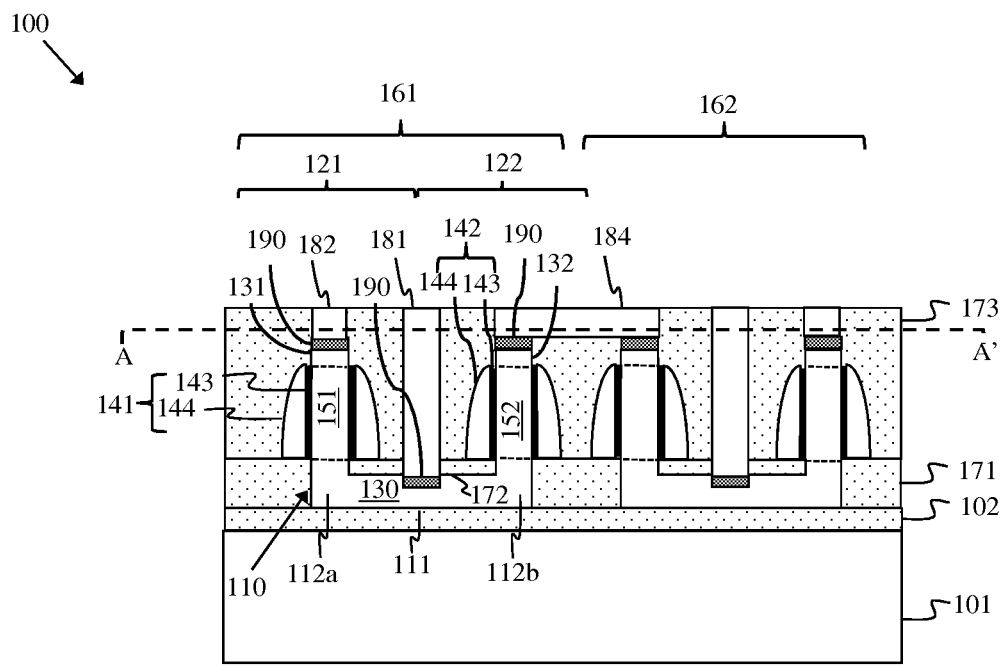
FIG. 1A is a cross-section diagram illustrating a semiconductor structure comprising pair(s) of vertical field effect transistors.

As mentioned above, integrated circuit design decisions are often driven by device scalability, manufacturing efficiency and costs. For example, size scaling of single-gate planar field effect transistors (FETs) resulted in devices with a smaller channel length. Unfortunately, the smaller channel length resulted in a corresponding increase in short channel effects and a decrease in drive current. In response, different types of multi-gate non-planar field effect transistors (MUG-FETs), such as dual-gate non-planar FETs (also referred to herein as fin-type FETs (FINFETs)) and tri-gate non-planar FETs, which comprise one or more semiconductor fins, were developed in order to provide reduced-size field effect transistors, while simultaneously avoiding corresponding increases in short channel effects and decreases in drive current. Unfortunately, further size scaling of conventional MUGFETs has been limited by the required specifications for the different features of such devices. For example, a minimum gate length is required in order to switch a MUGFET on and off. This minimum gate length must, in turn, be considered in setting the pitch between source/drain contacts. Additionally, in MUGFETs that incorporate multiple semiconductor fins to increase transistor width and, thereby drive current, the pitch between semiconductor fins must be sufficiently large so as to allow for deposition of gate material between the semiconductor fins. Finally, the thickness of the semiconductor layer used to form the MUGFET must be equal to the height of the semiconductor fin(s).

In view of the foregoing, disclosed herein are semiconductor structures configured to allow for continued size scaling of field effect transistors. The semiconductor structures each comprise a pair of vertical field effect transistors formed from an essentially U-shaped semiconductor body. This semiconductor body has a horizontal section and first and second vertical sections. The horizontal section can comprise a shared source/drain region for first and second vertical field effect transistors. The first and second vertical sections can each comprise a channel region and a source/drain region above the channel region for the first and second vertical field effect transistors, respectively. In one semiconductor structure, each vertical section has a gate wrapped around the channel region. In another semiconductor structure, each vertical section has a front gate positioned adjacent to the inner vertical surface at the channel region and a back gate positioned adjacent to the outer vertical surface at the channel region. In any case, a contact, which is electrically isolated from the gates, can extend vertically to the shared source/drain region in the horizontal section. Optionally, metal strap (s) can electrically connect the pair of vertical field effect transistors to adjacent pair(s) of vertical field effect transistors. Also disclosed herein are methods of forming such semiconductor structures.

Figure 1B:
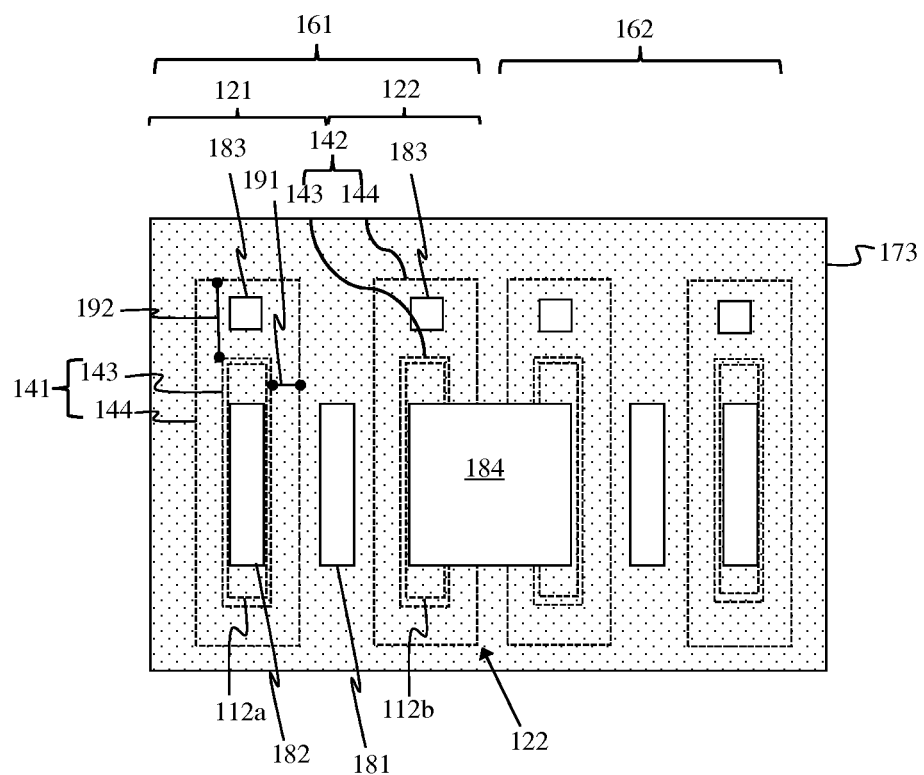
FIG. 1B is a top view diagram illustrating the semiconductor structure of FIG. 1A.

More particularly, referring to FIGS. 1A-1B, disclosed herein is a semiconductor structure 100. This semiconductor structure 100 can comprise at least one pair 161-162 of vertical field effect transistors 121-122. For purposes of illustration, two pairs of vertical field effect transistors are shown; however, it should be understood that the semiconductor structure 100 could comprise any number of one or more pairs of vertical field effect transistors. It should be understood that the term vertical field effect transistor refers to a field effect transistor in which a channel region is stacked vertically between source/drain regions (i.e., in which a channel region is on top of a source/drain region and another source/drain region is on top of the channel region) as opposed to being positioned laterally between the source/drain regions.

Each pair (e.g., pair 161) of vertical field effect transistors can be formed using an essentially U-shaped semiconductor body 110. Specifically, the U-shaped semiconductor body 110 can be positioned above and immediately adjacent to an insulator layer 102 (e.g., a buried oxide (BOX) layer or other suitable insulator layer) on a semiconductor substrate 101 (e.g., on a silicon substrate or any other suitable semiconductor substrate) (as shown). Alternatively, the U-shaped semiconductor body 110 can be formed from an upper portion of a bulk semiconductor substrate (e.g., a bulk silicon substrate or any other suitable bulk semiconductor substrate) and electrically isolated from a lower portion of the bulk semiconductor substrate by a buried well region (not shown).

In any case, the U-shaped semiconductor body 110 can comprise a horizontal section 111 (e.g., immediately adjacent to the insulator layer 102), a first vertical section 112a that extends vertically from a first end of the horizontal section 111, and a second vertical section 112b that extends vertically from a second end of the horizontal section 111 opposite the first end such that the first vertical section 112a and second vertical section 112b are parallel. The horizontal section 111 can comprise a shared source/drain region 130 for the pair 161 of vertical field effect transistors 121-122. The first vertical section 112a can comprise, for a first vertical field effect transistor 121 in the pair 161, a first channel region 151 adjacent to the shared source/drain region 130 in the horizontal section 111 and a first source/drain region 131 above the first channel region 151. The second vertical section 112b can be parallel to the first vertical section 112a and can comprise, for a second vertical field effect transistor 122 in the pair 161, a second channel region 152 adjacent to the shared source/drain region 130 in the horizontal section 111 and a second source/drain region 132 above the second channel region 152. Thus, for example, the lower portion of the first and second vertical sections 112a-b containing the first and second channel regions 151-152, respectively, can have a first type conductivity (e.g., P-type conductivity), whereas the horizontal section 111 containing the shared source/drain region 130 as well as the upper portions of the first and second vertical sections 112a-b containing the first and second source/drain regions 131-132 can have a second type conductivity (e.g., N-type conductivity) that is different from the first type conductivity.

Optionally, the horizontal and/or vertical sections of the U-shaped semiconductor body 110 can comprise one or more additional doped regions (not shown) including, but are not limited to, source/drain extension regions and/or halo regions between the first and second channel regions 151-152 and the shared source/drain region 130 and/or between the first and second channel regions 151-152 and the first and second source/drain regions 131-132.

Optionally, the U-shaped semiconductor body 110 can comprise a single type of monocrystalline semiconductor material (e.g., silicon or any other suitable monocrystalline semiconductor material). Alternatively, the U-shaped semiconductor body 110 can comprise multiple different types of monocrystalline semiconductor materials. For example, during processing as discussed in greater detail below with regard to the methods, the semiconductor body 110 may be etched from a single semiconductor layer such that it comprises a single semiconductor material. Alternatively, it can be etched from a stack of multiple semiconductor layers such that it comprises different semiconductor materials at different levels. Thus, the horizontal section 111 containing the shared source/drain region 130, the lower portion of the first and second vertical sections 112a-b containing the first and second channel regions 151-152 and/or the upper portion of the first and second vertical sections 112a-b containing the first and second source/drain regions 131-132 can comprise different types of semiconductor materials (e.g., silicon, silicon germanium, silicon germanium carbide, etc.). Those skilled in the art will recognize that different types of semiconductor materials can be used in different components of field effect transistors to tailor strain in the channel region.

One or more layers of dielectric material 171 (e.g., silicon dioxide, silicon nitride, etc.) can laterally surround the outer edges of the horizontal section 111 and a relatively thin portion 172 of the layer(s) of dielectric material 171 can cover the top surface of the horizontal section 111 between the first and second vertical sections 112a-b.

The semiconductor structure 100 can further comprise multiple gates. Specifically, the semiconductor structure 100 can comprise a first gate 141 for the first vertical field effect transistor 121 on the layer(s) of dielectric material 171 positioned laterally adjacent to a first vertical surface of the first vertical section 112a at the first channel region 151 and a second gate 142 for the second vertical field effect transistor 122 on the layer(s) of dielectric material 171 and positioned laterally adjacent to a second vertical surface of the second vertical section 112b at the second channel region 152. The first gate 141 and the second gate 142 can comprise, for example, multi-layered spacers. Each multi-layered spacer can comprise a gate dielectric layer 143 immediately adjacent to the vertical surface of the vertical section and a gate conductor layer 144 positioned laterally adjacent to the gate dielectric layer 143. The gate dielectric layer 143 can comprise, for example, a silicon dioxide layer, a silicon nitride layer, a silicon oxynitride layer, or any other suitable gate dielectric including, but not limited to, a high-K gate dielectric layer such as a hafnium (Hf)-based gate dielectric layer (e.g., hafnium oxide, hafnium silicon oxide, hafnium silicon oxynitride, hafnium aluminum oxide, etc.) or some other suitable high-K gate dielectric layer (e.g., aluminum oxide, tantalum oxide, zirconium oxide, etc.). The gate conductor layer 144 can comprise, for example, a doped polysilicon gate conductor layer, a metal gate conductor layer or any other suitable gate conductor layer.

It should be understood that, although a single gate dielectric layer 143 and a single gate conductor layer 144 are illustrated in each of the first gate 141 and second gate 142 of FIG. 1A, the gate dielectric layer 143 can comprise a stack of multiple gate dielectric materials and the gate conductor layer 144 can similarly comprise a stack of different gate conductor materials and these different gate conductor materials may vary depending upon the conductivity type of the field effect transistor. For example, for an N-type field effect transistor, the metal gate conductor layer can comprise a stack of metal and/or metal alloys including, but not limited to, at least one metal gate conductor having an N-type work function that is between about 3.9 eV and about 4.2 eV (i.e., an N-type metal gate conductor). Exemplary N-type metal gate conductors can comprise hafnium, zirconium, titanium, tantalum, aluminum, and alloys thereof, such as, hafnium carbide, zirconium carbide, titanium carbide, tantalum carbide, and aluminum carbide. For a P-type field effect transistor, the metal gate conductor layer can comprise a stack of metal and/or metal alloys including, but not limited to, at least one metal gate conductor having a P-type work function that is between about 4.9 eV and about 5.2 eV (i.e., a P-type metal gate conductor). Exemplary P-type metal gate conductors include, for example, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

Optionally, the first gate 141 can wrap entirely around the first vertical section 112a at the first channel region 151 and the second gate 142 can wrap entirely around the second vertical section 112b at the second channel region 152. In this case, the portion 172 of the layer(s) of dielectric material 171 on the top surface of the horizontal section 111 can electrically isolate the first and second gates 141-142 from the shared source/drain region 130.

It should be noted that, as illustrated in FIG. 1B, the gate conductor layer 144 can have a first thickness 191 on the opposing sides of the first and second vertical sections 112a-b and a second thickness 192 that is different from the first thickness on the opposing ends of the vertical sections 112a-b. This second thickness 192 can be relatively large as compared to the first thickness 191 so as to allow for landing of gate contacts 183 on the first and second gates 141-142 at one or both ends of the vertical sections 112a-b (i.e., to allow the gates 141-142 to be properly contacted).

Optionally, the semiconductor structure 100 can comprise silicide layers 190 on the top surfaces of the first and second vertical sections 112a-b and/or the center portion of the horizontal section 111. The silicide layer(s) 190 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. As discussed in detail below with regard to the methods, the process of forming the silicide layer 190 on the top surface of the center portion of the horizontal section 111 can, depending upon the thickness of the horizontal section 111, consume that entire center portion such that the shared source/drain region 130 is divided into two discrete sections separated by the silicide layer 190.

The semiconductor structure 100 can further comprise one or more layers of interlayer dielectric material 173 (e.g., silicon dioxide, silicon nitride, borophosphosilicate glass (BPSG), etc.) on the dielectric material 171, including on the portion 172 of dielectric material 171 between the first and second vertical sections 112a-b, and further covering the first and second gates 141-142 and the upper portions of the first and second vertical sections 112a-b that extend vertically above the level of the first and second gates 141-142. Multiple contacts 181-183 can extend vertically through the interlayer dielectric material 173 to the different components of the pair 161 of vertical field effect transistors. Specifically, a shared source/drain region contact 181 can extend vertically through the interlayer dielectric material 173 such that it is positioned laterally between and electrically isolated from the first and second gates 141-142. This contact 181 can further extend vertically through the thin portion 172 of the dielectric material 171 to the center portion of the horizontal section 111 below (i.e., to the shared source/drain region 130). Additional source/drain contacts 182 can extend vertically through the interlayer dielectric material 173 to the first and second source/drain regions 131-132 at the top of the first and second vertical sections 112a-b of the semiconductor body 110. Gate contacts 183 can extend vertically through the interlayer dielectric material 173 to the first and second gates 141-142. Such contacts 181-183 can be non-self-aligned (as shown) or self-aligned. Self-aligned contacts are well known in the art and, thus, the details thereof are omitted from this specification in order to allow the reader to focus on the salient aspects of the disclosure. Optionally, rather than simply contacting the first and second source/drain regions 131-132, metal strap (s) 184 (i.e., wire(s), local interconnect(s), etc.) can be formed in the interlayer dielectric material 173 at the top of the first and/or second vertical sections 112a-b in order to electrically connect the first and/or second source/drain regions 131-132 of the first and/or second vertical field effect transistors 121-122 in the pair 161 to adjacent pair(s) (e.g., additional pair 162) of vertical field effect transistors.

In the semiconductor structure 100 described above and illustrated in FIGS. 1A-1B, an exemplary configuration is discussed wherein the first and second gates 140-141 wrap entirely around the first and second channel regions 151-152 in the first and second vertical sections 112a-b, respectively, of the U-shaped semiconductor body 110. However, it should be understood that alternative gate configurations could be used. For example, in another semiconductor structure 200 as shown in FIGS. 2A-2B, discrete front and back gates can be positioned on opposing vertical surfaces of the first and second vertical sections of the U-shaped semiconductor body.

Figure 2A:
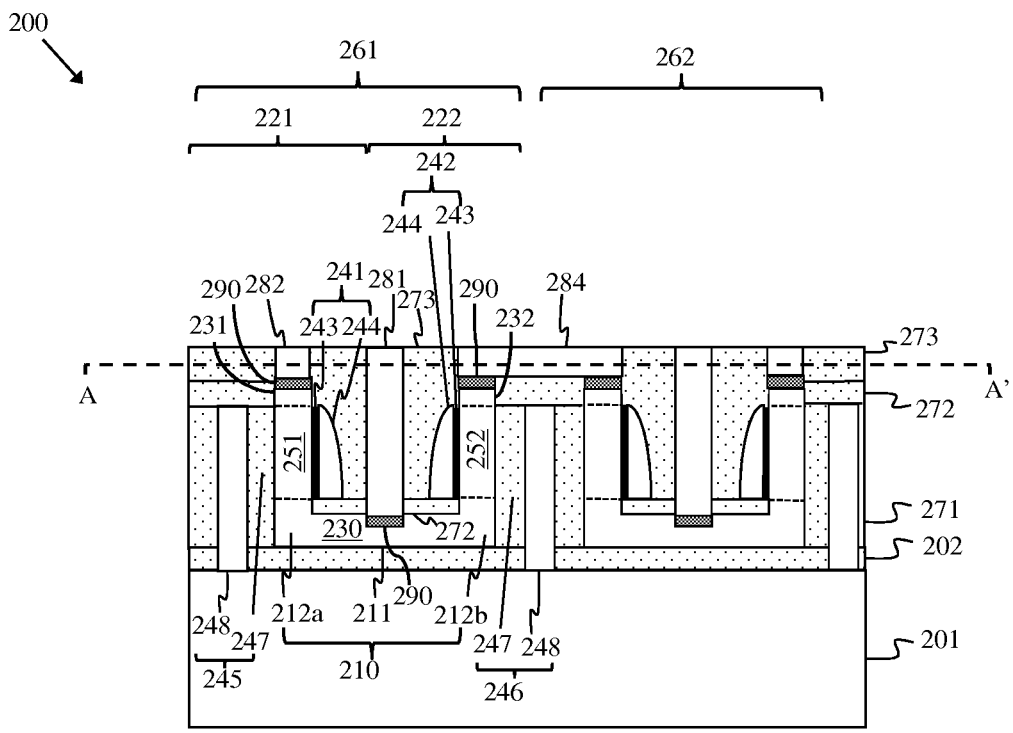
FIG. 2A is a cross-section diagram illustrating another semiconductor structure comprising pair(s) of vertical field effect transistors.
Figure 2B:
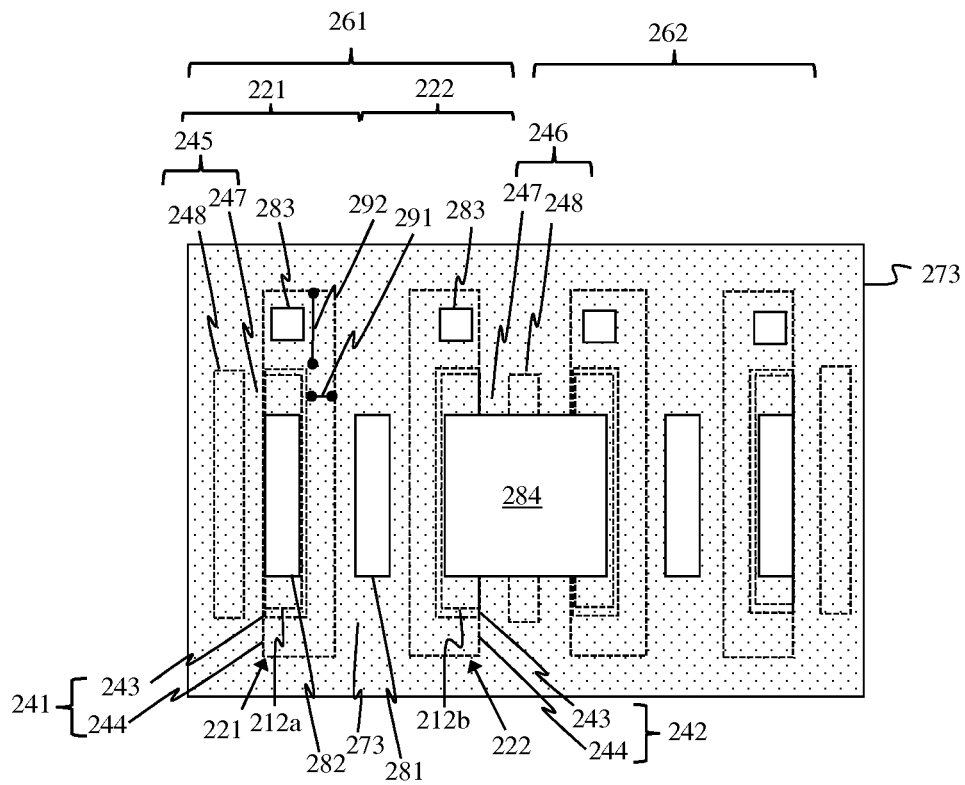
FIG. 2B is a top view diagram illustrating the semiconductor structure of FIG. 1A.

Specifically, referring to FIGS. 2A-2B, disclosed herein is a semiconductor structure 200. This semiconductor structure 200 can comprise at least one pair 261-262 of vertical field effect transistors 221-222. For purposes of illustration, two pairs of vertical field effect transistors are shown; however, it should be understood that the semiconductor structure 100 could comprise any number of one or more pairs of vertical field effect transistors.

Each pair (e.g., pair 261) of vertical field effect transistors can be formed using an essentially U-shaped semiconductor body 210. Specifically, the U-shaped semiconductor body 210 can be positioned above and immediately adjacent to an insulator layer 202 (e.g., a buried oxide (BOX) layer or other suitable insulator layer) on a semiconductor substrate 201 (e.g., on a silicon substrate or any other suitable semiconductor substrate) (as shown). Alternatively, the U-shaped semiconductor body 210 can be formed from an upper portion of a bulk semiconductor substrate (e.g., a bulk silicon substrate or any other suitable bulk semiconductor substrate) and electrically isolated from a lower portion of the bulk semiconductor substrate by a buried well region (not shown).

In any case, the U-shaped semiconductor body 210 can comprise a horizontal section 211 (e.g., immediately adjacent to the insulator layer 202), a first vertical section 212a that extends vertically from a first end of the horizontal section 211 and has first opposing vertical surfaces, and a second vertical section 212b that extends vertically from a second end of the horizontal section 211 opposite the first end and has second opposing vertical surfaces. Thus, the first vertical section 211a and the second vertical section 212b are parallel. The horizontal section 211 can comprise a shared source/drain region 230 for the pair 261 of vertical field effect transistors 221-222. The first vertical section 212a can comprise, for a first vertical field effect transistor 221 in the pair 261, a first channel region 251 adjacent to the shared source/drain region 230 in the horizontal section 111 and a first source/drain region 231 above the first channel region 251. The second vertical section 212b can be parallel to the first vertical section 212a and can comprise, for a second vertical field effect transistor 222 in the pair 261, a second channel region 252 adjacent to the shared source/drain region 230 in the horizontal section 211 and a second source/drain region 232 above the second channel region 252. Thus, for example, the lower portion of the first and second vertical sections 212a-b containing the first and second channel regions 251-252, respectively, can have a first type conductivity (e.g., P-type conductivity), whereas the horizontal section 211 containing the shared source/drain region 230 as well as the upper portions of the first and second vertical sections 212a-b containing the first and second source/drain regions 231-232 can have a second type conductivity (e.g., N-type conductivity) that is different from the first type conductivity.

Optionally, the horizontal and/or vertical sections of the U-shaped semiconductor body 210 can comprise one or more additional doped regions (not shown) including, but are not limited to, source/drain extension regions and/or halo regions between the first and second channel regions 251-252 and the shared source/drain region 230 and/or between the first and second channel regions 251-252 and the first and second source/drain regions 231-232.

Optionally, the U-shaped semiconductor body 210 can comprise a single type of monocrystalline semiconductor material (e.g., silicon or any other suitable monocrystalline semiconductor material). Alternatively, the U-shaped semiconductor body 210 can comprise multiple different types of monocrystalline semiconductor materials. For example, during processing as discussed in greater detail below with regard to the methods, the semiconductor body 210 may be etched from a single semiconductor layer such that it comprises a single semiconductor material. Alternatively, it can be etched from a stack of multiple semiconductor layers such that it comprises different semiconductor materials at different levels. Thus, the horizontal section 211 containing the shared source/drain region 230, the lower portion of the first and second vertical sections 212a-b containing the first and second channel regions 251-252 and/or the upper portion of the first and second vertical sections 212a-b containing the first and second source/drain regions 231-232 can comprise different types of semiconductor materials (e.g., silicon, silicon germanium, silicon germanium carbide, etc.). Those skilled in the art will recognize that different types of semiconductor materials can be used in different components of field effect transistors in order to tailor strain in the channel region.

One or more layers of dielectric material 271 (e.g., silicon dioxide, silicon nitride, etc.) can laterally surround the outer edges of the horizontal section 211 and a relatively thin layer of additional dielectric material 272 (e.g., silicon dioxide, silicon nitride, etc.) can cover the top surface of the horizontal section 211 between the first and second vertical sections 212a-b.

The semiconductor structure 200 can further comprise multiple gates. Specifically, the semiconductor structure can comprise first gates (i.e., a first front gate 241 and a first back gate 245) for the first vertical field effect transistors 221 adjacent to the first opposing vertical surfaces of the first vertical section 212a at the first channel region 251 and second gates (i.e., a second front gate 242 and a second back gate 246) for the second vertical field effect transistors 222 adjacent to the second opposing vertical surfaces of the second vertical section 212b at the second channel region 252.

The first front gate 241 can be positioned on the layer of additional dielectric material 272 above the horizontal section 211 and positioned laterally adjacent to a first vertical surface of the first vertical section 212a at the first channel region 251 and the second front gate 242 can also be positioned on the layer of additional dielectric material 272 above the horizontal section 211 and positioned laterally adjacent to a second vertical surface of the second vertical section 212b at the second channel region 252. The first front gate 241 and the second front gate 242 can comprise, for example, multi-layered spacers. Each multi-layered spacer can comprise a gate dielectric layer 243 immediately adjacent to a vertical surface of a vertical section and a gate conductor layer 244 positioned laterally adjacent to the gate dielectric layer 243. The gate dielectric layer 243 can comprise, for example, a silicon dioxide layer, a silicon nitride layer, a silicon oxynitride layer, or any other suitable gate dielectric layer including, but not limited to, a high-K gate dielectric layer such as a hafnium (Hf)-based gate dielectric layer (e.g., hafnium oxide, hafnium silicon oxide, hafnium silicon oxynitride, hafnium aluminum oxide, etc.) or some other suitable high-K gate dielectric layer (e.g., aluminum oxide, tantalum oxide, zirconium oxide, etc.). The gate conductor layer 244 can comprise, for example, doped polysilicon gate conductor layer, a metal gate conductor layer or any other suitable gate conductor layer.

It should be understood that, although a single gate dielectric layer 243 and a single gate conductor layer 244 are illustrated in each of the first front gate 241 and second front gate 242 of FIG. 2A, the gate dielectric layer 243 can comprise a stack of multiple gate dielectric materials and the gate conductor layer 244 can similarly comprise a stack of different gate conductor materials and these different gate conductor materials may vary depending upon the conductivity type of the field effect transistor. For example, for an N-type field effect transistor, the metal gate conductor layer can comprise a stack of metal and/or metal alloys including, but not limited to, at least one metal gate conductor having an N-type work function that is between about 3.9 eV and about 4.2 eV (i.e., an N-type metal gate conductor). Exemplary N-type metal gate conductors can comprise hafnium, zirconium, titanium, tantalum, aluminum, and alloys thereof, such as, hafnium carbide, zirconium carbide, titanium carbide, tantalum carbide, and aluminum carbide. For a P-type field effect transistor, the metal gate conductor layer can comprise a stack of metal and/or metal alloys including, but not limited to, at least one metal gate conductor having a P-type work function that is between about 4.9 eV and about 5.2 eV (i.e., a P-type metal gate conductor). Exemplary P-type metal gate conductors include, for example, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

It should be noted that, as illustrated in FIG. 2B, the gate conductor layer 244 of the first front gate 241 and the second front gate 242 can wrap around the opposing ends of the first and second vertical sections 212a-b. This gate conductor layer 244 can have a first thickness 291 on one side of each of the first and second vertical sections 212a-b and a second thickness 292 that is different from the first thickness on the opposing ends of the first and second vertical sections 212a-b. This second thickness 292 can be relatively large as compared to the first thickness 291 so as to allow for landing of gate contacts 283 on the first and second front gates 241-242 at one or both ends of the first and second vertical sections 212a-b (i.e., to allow the first and second front gates 241-242 to be properly contacted).

The first back gate 245 can be positioned on a first vertical surface of the first vertical section 212a at the first channel region 251 and opposite the first front gate 241. Similarly, the second back gate 246 can be positioned on a second vertical surface of the second vertical section 212b at the second channel region 252 and opposite the second front gate 242. The first back gate 245 and second back gate 246 can each comprise opening, which extends vertically through the one or more layer(s) of dielectric material 271 below the level of the horizontal section 211 (e.g., through the insulator layer 202 and into the semiconductor substrate 201) and which is filled with a conductor 248 (also referred to herein as a conductive plate). The conductive plate 248 can comprise one or more conductive layers of a metal (e.g., copper, tungsten, aluminum or any other suitable metal), a metal alloy, or doped polysilicon. In this case, the portions of the one or more layer(s) of dielectric material 271 between each conductive plate 248 and the first and second vertical sections 212a-b will function as a gate dielectric 247 for the first and second back gates 245-246, respectively.

Optionally, the semiconductor structure 200 can comprise silicide layers 290 on the top surfaces of the first and second vertical sections 212a-b and/or the center portion of the horizontal section 211. The silicide layer(s) 290 can comprise, for example, a silicide of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof. As discussed in detail below with regard to the methods, the process of forming the silicide layer 290 on the top surface of the center portion of the horizontal section 211 can, depending upon the thickness of the horizontal section 211, consume that entire center portion such that the shared source/drain region 230 is divided into two discrete sections separated by the silicide layer 290.

The semiconductor structure 200 can further comprise one or more layer(s) of interlayer dielectric material 273 (e.g., silicon dioxide, silicon nitride, borophosphosilicate glass (BPSG), etc.) on the dielectric material 271, on the thin layer of additional dielectric material 272 between the first and second vertical sections 212a-b, and further covering the first and second front gates 241-142, the upper portions of the first and second vertical sections 212a-b that extend vertically above the level of the first and second front gates 241-242. Multiple contacts 281-283 can extend vertically to the different components of the pair 261 of vertical field effect transistors. Specifically, a shared source/drain region contact 281 can extend vertically through the interlayer dielectric material 273 such that it is positioned laterally between and electrically isolated from the first and second gates 241-242. This contact 281 can further extend vertically through the layer of additional dielectric material 272 to a center portion of the horizontal section 211 below (i.e., to the shared source/drain region 230). Additional source/drain contacts 282 can extend vertically through the interlayer dielectric material 273 to the first and second source/drain regions 231-232 at the top of the first and second vertical sections 212a-b of the semiconductor body 210. Gate contacts 283 can extend vertically through the interlayer dielectric material 273 to the first and second front gates 241-242. Such contacts 281-283 can be non-self-aligned (as shown) or self-aligned. Self-aligned contacts are well known in the art and, thus, the details thereof are omitted from this specification in order to allow the reader to focus on the salient aspects of the disclosure. Alternatively, rather than simply contacting the source/drain regions 231-232, metal strap(s) 284 (i.e., wire(s), local interconnect(s), etc.) at the top of the first and/or second vertical sections 212a-b can electrically connect the first and/or second source/drain regions 231-232 of the first and/or second vertical field effect transistors 221-222 in the pair 261 to adjacent pair(s) (e.g., additional pair 262) of vertical field effect transistors.

Figure 3:
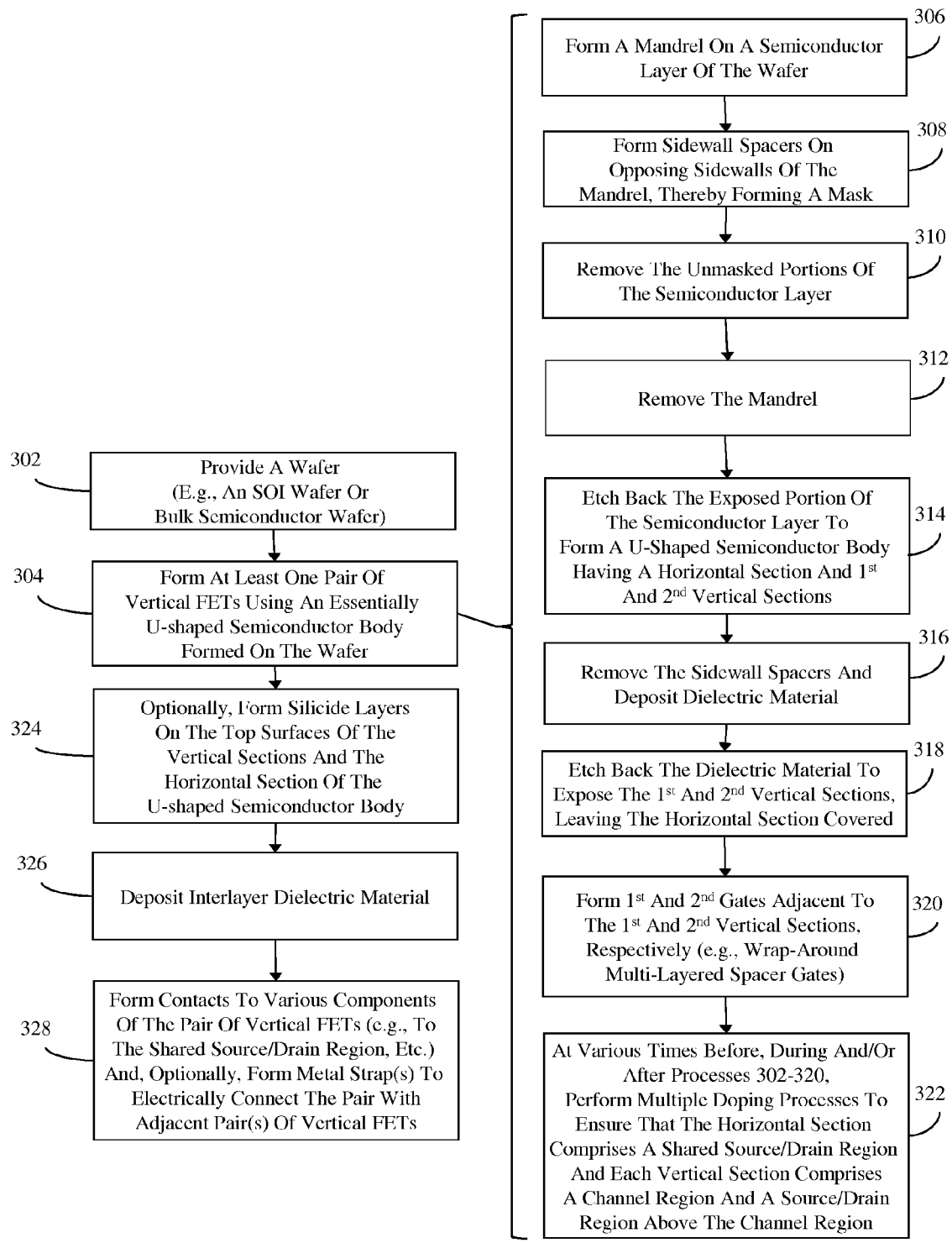
FIG. 3 is a flow diagram illustrating a method of forming the semiconductor structure of FIGS. 1A-1B.
Figure 4:
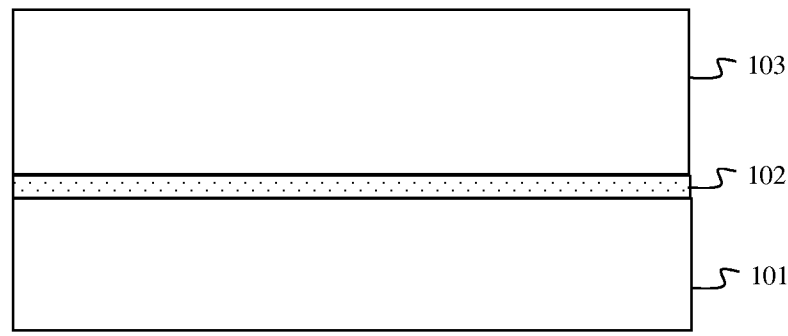
FIG. 4 is a cross-section diagram illustrating a partially completed semiconductor structure formed according to the method of FIG. 3.

Also disclosed herein are methods of forming such semiconductor structures 100, 200. For example, referring to FIG. 3, one method of forming a semiconductor structure 100, as illustrated in FIGS. 1A-1B, can begin by providing a wafer (302). This wafer can comprise, for example, a semiconductor-on-insulator (SOI) wafer comprising a stack of one or more semiconductor layers 103 (see detailed discussion below) immediately adjacent to an insulator layer 102 (e.g., a buried oxide (BOX) layer or other suitable insulator layer) on a semiconductor substrate 101 (e.g., on a silicon substrate or any other suitable semiconductor substrate) (see FIG. 4). Alternatively, the wafer can comprise a bulk semiconductor substrate with a buried well region, which can provide electrically isolation between upper and lower portions of the semiconductor substrate (not shown). For purposes of illustration, the processes required to form the semiconductor structure 100 will be described below and illustrated in the Figures with respect to an SOI wafer.

The method can further comprise forming at least one pair of vertical field effect transistors on the wafer (304). For purposes of illustration formation of the pair 161 shown in FIGS. 1A-1B is described; however, it should be understood that one or more additional pairs of vertical field effect transistors (e.g., see pair 162) could simultaneously be formed. To form a pair of vertical field effect transistors, such as the pair 161 in FIGS. 1A-1B, an essentially U-shaped semiconductor body 110 must first be formed such that it comprises a horizontal section 111, a first vertical section 112a that extends vertically from a first end of the horizontal section 111 and a second vertical section 112b that is parallel to the first vertical section 112a and that extends vertically from a second end of the horizontal section 111 opposite the first end.

Figure 5:
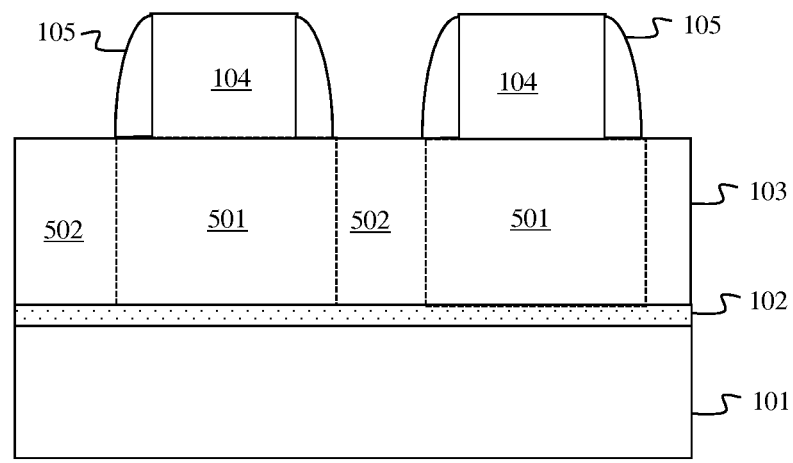
FIG. 5 is a cross-section diagram illustrating a partially completed semiconductor structure formed according to the method of FIG. 3.

For example, to form this U-shaped semiconductor body 110, a mandrel 104 can be formed on the semiconductor layer 103 and sidewall spacers 105 can be formed on opposing sidewalls of the mandrel 104 (306-308, see FIG. 5). The mandrel 104 can be formed, for example, by depositing a mandrel material layer on the semiconductor layer 103. The mandrel material layer can comprise, for example, a dielectric material, such as silicon dioxide, or any other suitable mandrel material that can be selectively etched over the semiconductor layer 103 below. The mandrel material layer can then be lithographically patterned and etched to form an essentially rectangular-shaped body (referred to herein as a mandrel) above the semiconductor layer 103. Next, sidewall spacers 105 can be formed on the opposing sidewalls of the mandrel 104 using conventional sidewall spacer formation techniques. The sidewall spacers 105 can comprise, for example, another dielectric material, such as silicon nitride, or any other suitable spacer material that can be selectively etched over the semiconductor layer 103 below. It should be noted that the spacer material should specifically be selected so that the mandrel 104 can also be selectively etched over the sidewall spacers 105. As a result of processes 306-308, the semiconductor layer 103 will have a masked portion 501, which is aligned below the mandrel 104 and the sidewall spacers 105 and which is positioned laterally between unmasked portions 502.

Figure 6:
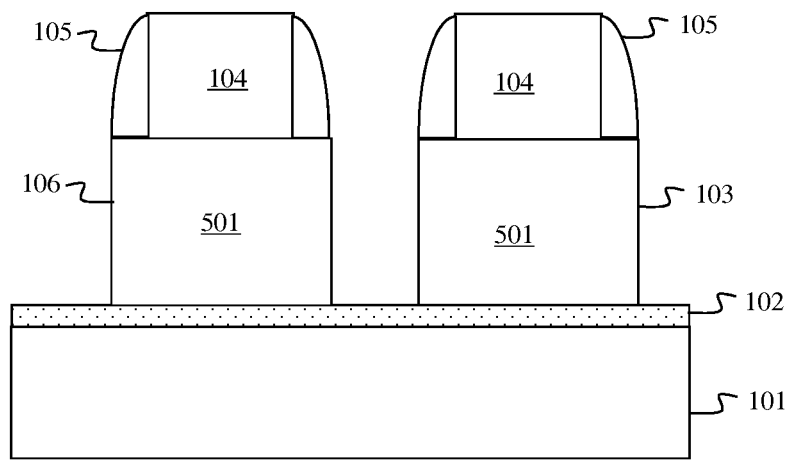
FIG. 6 is a cross-section diagram illustrating a partially completed semiconductor structure formed according to the method of FIG. 3.
Figure 7:
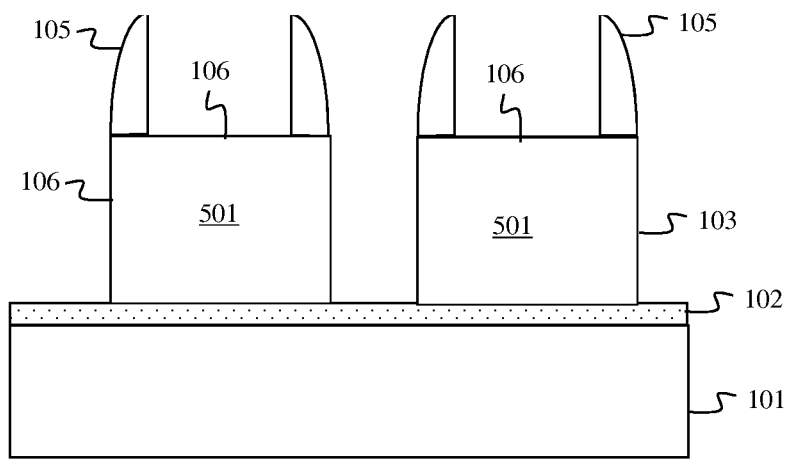
FIG. 7 is a cross-section diagram illustrating a partially completed semiconductor structure formed according to the method of FIG. 3.
Figure 8:
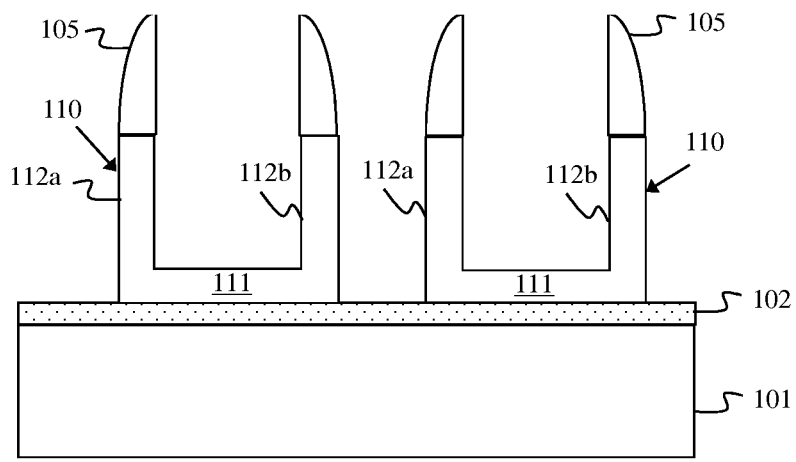
FIG. 8 is a cross-section diagram illustrating a partially completed semiconductor structure formed according to the method of FIG. 3.

The unmasked portions 502 of the semiconductor layer 103 can be removed (e.g., using an anisotropic reactive ion etch (RIE) process) (310, see FIG. 6). Then, the mandrel 104 can be selectively removed (312, see FIG. 7). Those skilled in the art will recognize that the etch process used to remove the mandrel 104 will depend upon the materials used for the mandrel 104, the sidewall spacers 105 and the semiconductor layer 103. Following removal of the mandrel 104 at process 312, an exposed portion 106 of the previously masked portion 501 of the semiconductor layer 103 between the sidewall spacers 105 can be etched back some distance less than the full thickness of the semiconductor layer 103 (e.g., using an anisotropic RIE process), thereby forming the U-shaped semiconductor body 110 with the first vertical section 112a, the second vertical section 112b and the horizontal section 111 between the first vertical section 112a and the second vertical section 112b (314, see FIG. 8).

As mentioned above, the wafer provided at process 302 can comprise a stack of one or more semiconductor layers 103 on an insulator layer 102. If the wafer comprises only a single semiconductor layer, the U-shaped semiconductor body 110 will similarly comprise only a single semiconductor layer. However, alternatively, the wafer can comprise multiple different semiconductor layers 103 on the insulator layer 102. In this case, the U-shaped semiconductor body 110 can be formed such the horizontal section 111, the lower portion of the first and second vertical sections 112a-b and/or the upper portion of the first and second vertical sections 112a-b comprise different types of semiconductor materials (e.g., silicon, silicon germanium, silicon germanium carbide, etc.). Those skilled in the art will recognize that different types of semiconductor materials can be used in different components of field effect transistors to tailor strain in the channel region.

Figure 9:
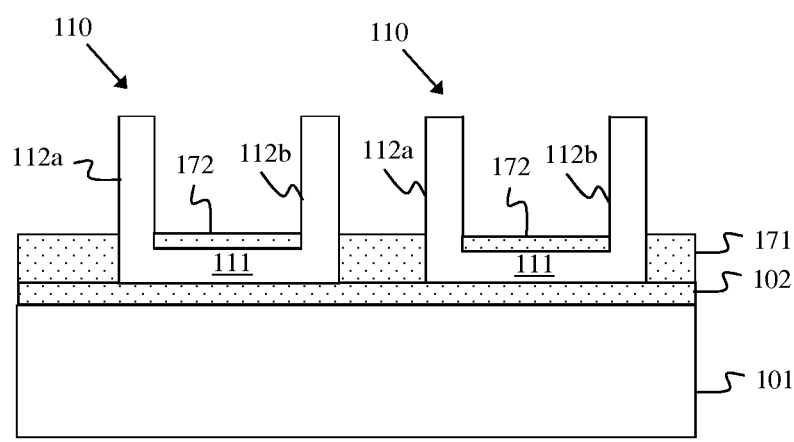
FIG. 9 is a cross-section diagram illustrating a partially completed semiconductor structure formed according to the method of FIG. 3.

After the U-shaped semiconductor body 110 is formed at process 314, the sidewall spacers 105 can be selectively removed. Those skilled in the art will recognize that the etch process used to remove the sidewall spacers 105 will depend upon the materials used for the sidewall spacers 105 and the semiconductor layer 103 below. Next, one or more layers of dielectric material 171 (e.g., silicon dioxide, silicon nitride, etc.) can be deposited over the semiconductor body 110 and planarized to expose the top surfaces of the first and second vertical sections 112a-b (316). The dielectric material 171 can then be etched back (e.g., using a buffered hydrofluoric acid (BHF) wet etch process) to expose vertical surfaces of the first vertical section 112a and the second vertical section 112b (318, see FIG. 9). It should be noted that this process 316 should be timed so that etching is stopped before the top surface of the horizontal section 111 is exposed. That is, this etch back process 316 should performed such that the horizontal section 111 between the first vertical section 112a and the second vertical section 112b remains covered by a relatively thin portion 172 of the dielectric material 171.

Figure 10A:
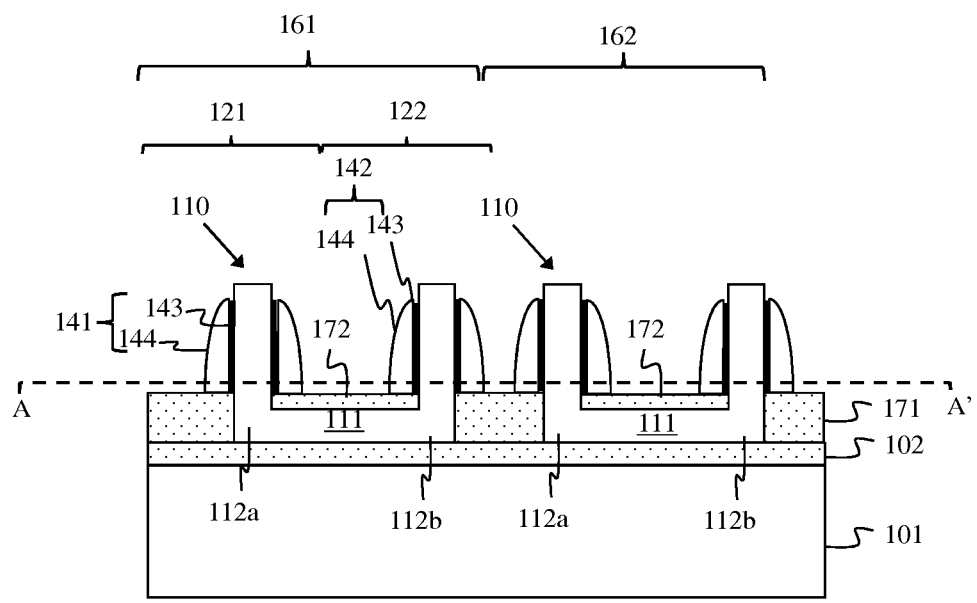
FIG. 10A is a cross-section diagram illustrating a partially completed semiconductor structure formed according to the method of FIG. 3.

Next, multiple gates 141-142 can be formed (320, see FIG. 10A). Specifically, a first gate 141 for the first vertical field effect transistor 121 can be formed on the dielectric material 272 and positioned laterally adjacent to a first vertical surface of the first vertical section 112a and a second gate 142 for the second vertical field effect transistor 122 can be formed on the dielectric material 171 and positioned laterally adjacent to a second vertical surface of the second vertical section 112b.

The first gate 141 and the second gate 142 can each be formed so as to comprise, for example, multi-layered spacers. That is, a conformal gate dielectric layer 143 can be deposited such that it is immediately adjacent to the exposed vertical surfaces of the vertical sections 112a-b. The gate dielectric layer 143 can comprise, for example, a silicon dioxide layer, a silicon nitride layer, a silicon oxynitride layer, or any other suitable gate dielectric layer including, but not limited to, a high-K gate dielectric layer such as a hafnium (Hf)-based gate dielectric layer (e.g., hafnium oxide, hafnium silicon oxide, hafnium silicon oxynitride, hafnium aluminum oxide, etc.) or some other suitable high-K dielectric material (e.g., aluminum oxide, tantalum oxide, zirconium oxide, etc.). Next, a gate conductor layer 144 can be deposited on the gate dielectric layer 143. The gate conductor layer 144 can comprise, for example, a polysilicon gate conductor layer, a metal gate conductor layer or any other suitable gate conductor layer.

It should be understood that, although a single gate dielectric layer 143 and a single gate conductor layer 144 are illustrated, the gate dielectric layer 143 can comprise a stack of multiple gate dielectric materials and the gate conductor layer 144 can similarly comprise a stack of different gate conductor materials and these different gate conductor materials may vary depending upon the conductivity type of the field effect transistor. For example, for an N-type field effect transistor, the metal gate conductor layer can comprise a stack of metal and/or metal alloys including, but not limited to, at least one metal gate conductor having an N-type work function that is between about 3.9 eV and about 4.2 eV (i.e., an N-type metal gate conductor). Exemplary N-type metal gate conductors can comprise hafnium, zirconium, titanium, tantalum, aluminum, and alloys thereof, such as, hafnium carbide, zirconium carbide, titanium carbide, tantalum carbide, and aluminum carbide. For a P-type field effect transistor, the metal gate conductor layer can comprise a stack of metal and/or metal alloys including, but not limited to, at least one metal gate conductor having a P-type work function that is between about 4.9 eV and about 5.2 eV (i.e., a P-type metal gate conductor). Exemplary P-type metal gate conductors include, for example, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

Next, an anisotropic spacer etch process can be performed to remove the gate materials from horizontal surfaces of the semiconductor body 110, thereby creating multi-layered spacers positioned laterally adjacent to the vertical surfaces of the first and second vertical sections 112a-b. It should be noted that this spacer etch process should be performed so that the upper portions of the first and second vertical sections 112a-b are also exposed. As a result of the processes described above, the first gate 141 will wrap entirely around the first vertical section 112a and the second gate 142 will wrap entirely around the second vertical section 112b.

Figure 10B:
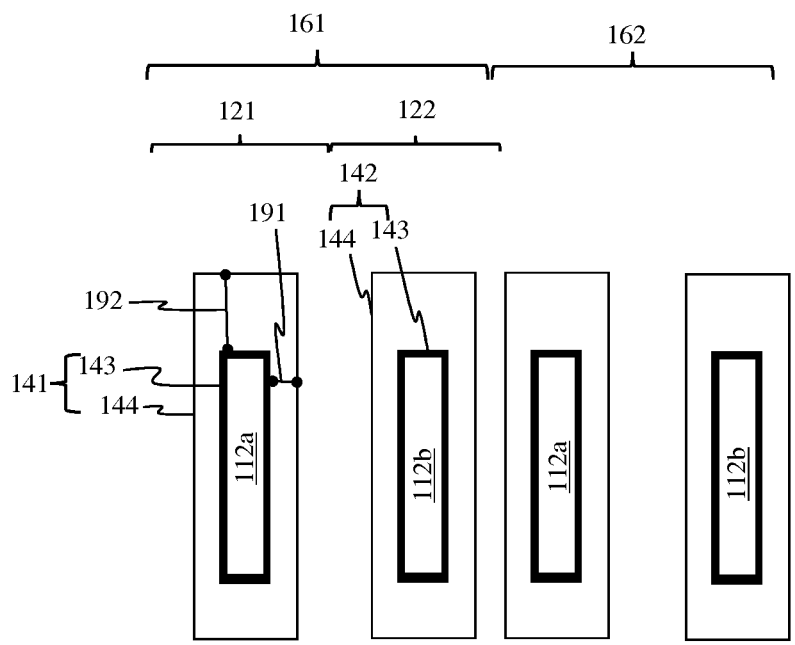
FIG. 10B is a top view diagram illustrating the partially completed semiconductor structure of FIG. 10A.

It should be noted that, if the gate conductor layer 144 of the multi-layered spacers formed as a result of the process steps described above is too narrow to receive a contact, then additional gate conductor deposition and lithographic patterning steps may be required to increase the thickness 192 of the gate conductor layer 144 on one or both of the opposing ends of the first and second vertical sections 112a-b as compared to the thickness 191 of the gate conductor layer 144 on the opposing sides (as shown in FIG. 10B).

Figure 11:
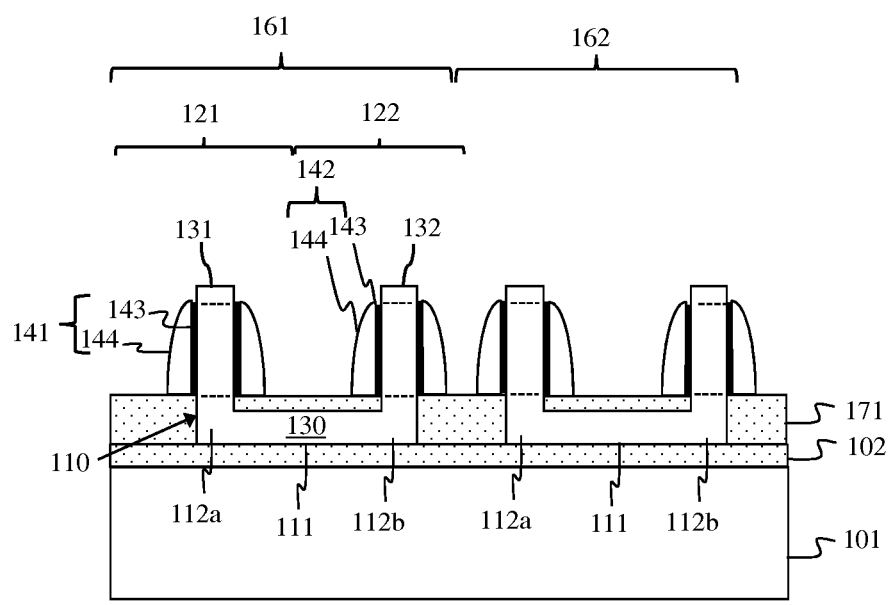
FIG. 11 is a cross-section diagram illustrating a partially completed semiconductor structure formed according to the method of FIG. 3.

At various times before, during (i.e., in between), and/or after the above-described processes 306-320, various doping processes can be performed so that in the resulting semiconductor structure 100 and, particularly, in the resulting U-shaped semiconductor body 110, the horizontal section 111 comprises a shared source/drain region 130 for the pair 161 of vertical field effect transistors, the first vertical section 112a comprises, for the first vertical field effect transistor 121 in the pair 161, a first channel region 151 adjacent to the shared source/drain region 130 in the horizontal section 111 and a first source/drain region 131 above the first channel region 151 and, the second vertical section 112b comprises, for the second vertical field effect transistor 122 in the pair 161, a second channel region 152 adjacent to the shared source/drain region 130 in the horizontal section 111 and a second source/drain region 132 above the second channel region 152 (322, see FIG. 11). Thus, for example, these doping processes 322 can be performed such that the lower portion of the first and second vertical sections 112a-b containing the first and second channel regions 151-152, respectively, can have a first type conductivity (e.g., P-type conductivity), whereas the horizontal section 111 containing the shared source/drain region 130 as well as the upper portions of the first and second vertical sections 112a-b containing the first and second source/drain regions 131-132 can have a second type conductivity (e.g., N-type conductivity) that is different from the first type conductivity. Optionally, additional doping processes may be performed so that the horizontal and/or vertical sections of the U-shaped semiconductor body 110 comprise one or more additional doped regions (not shown) including, but are not limited to, source/drain extension regions and/or halo regions between the first and second channel regions 151-152 and the shared source/drain region 130 and/or between the first and second channel regions 151-152 and the first and second source/drain regions 131-132.

Optionally, an opening can be formed in the thin portion 172 of dielectric material 171 on the horizontal section 111 (e.g., using lithographic patterning and etch techniques) and silicide layers 190 can be formed the exposed top surfaces of the first and second vertical sections 112a-b and the center portion of the horizontal section 111 (324, see FIGS. 1A-1B). The silicide layer(s) 190 can be formed using conventional processing techniques. For example, a layer of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof can be conformally deposited over the structure and, specifically, onto the exposed semiconductor surfaces. Next, an anneal process can be performed. Any metal remaining present after the anneal process is performed can be selectively removed. It should be noted that this process 324 of forming the silicide layers 190 can, depending upon the thickness of the horizontal section 111, consume the entire center portion of the horizontal section 111 such that the shared source/drain region 130 will be divided into two discrete sections separated by a silicide layer 190 (not shown).

After silicide formation, one or more layers of interlayer dielectric material 173 (e.g., silicon dioxide, silicon nitride, borophosphosilicate glass (BPSG), etc.) can be deposited (326). Next, multiple contacts 181-183 can be formed that extend vertically through the interlayer dielectric material 173 to the different components of the pair 161 of vertical field effect transistors (328). Specifically, a shared source/drain region contact 181 can be formed such that it extends vertically through the interlayer dielectric material 173 and further through the thin portion 172 of the dielectric material 171 to the center portion of the horizontal section 111 below (i.e., to the shared source/drain region 130). Thus, this shared source/drain region contact 181 will be positioned laterally between and will be electrically isolated from the first and second gates 141-142. Additional source/drain contacts 182 can be formed that extend vertically through the interlayer dielectric material 173 to the first and second source/drain regions 131-132 at the top of the first and second vertical sections 112a-b of the semiconductor body 110. Gate contacts 183 can be formed that extend vertically through the interlayer dielectric material 173 to the first and second gates 141-142. Various techniques for forming either non-self-aligned contacts (as shown) and/or self-aligned contacts can be used at process 326 to form the contacts 181-183. Contact formation techniques are well known in the art and, thus, the details are omitted from this specification in order to allow the reader to focus on the salient aspects of the disclosure. Optionally, rather than simply contacting the first and second source/drain regions 131-132, metal strap(s) 184 (i.e., wire (s), local interconnect(s), etc.) can be formed in the interlayer dielectric material 173 at the top of the first and/or second vertical sections 112a-b (e.g., using conventional damascene processing techniques) in order to electrically connect the first and/or second source/drain regions 131-132 of the first and/or second vertical field effect transistors 121-122 in the pair 161 to adjacent pair(s) (e.g., additional pair 162) of vertical field effect transistors.

In the method described above and illustrated in the flow diagram of FIG. 3, exemplary process steps are discussed wherein the first and second gates 141-142 of the first and second vertical field effect transistors 121-122 in the pair 161 are formed so as to wrap entirely around the first and second vertical sections 112a-b, respectively, of the U-shaped semiconductor body 110. However, it should be understood that alternative and/or additional process steps could be performed to achieve semiconductor structures with alternative gate configurations (e.g., the semiconductor structure 200 of FIGS. 2A-2B).

Figure 12:
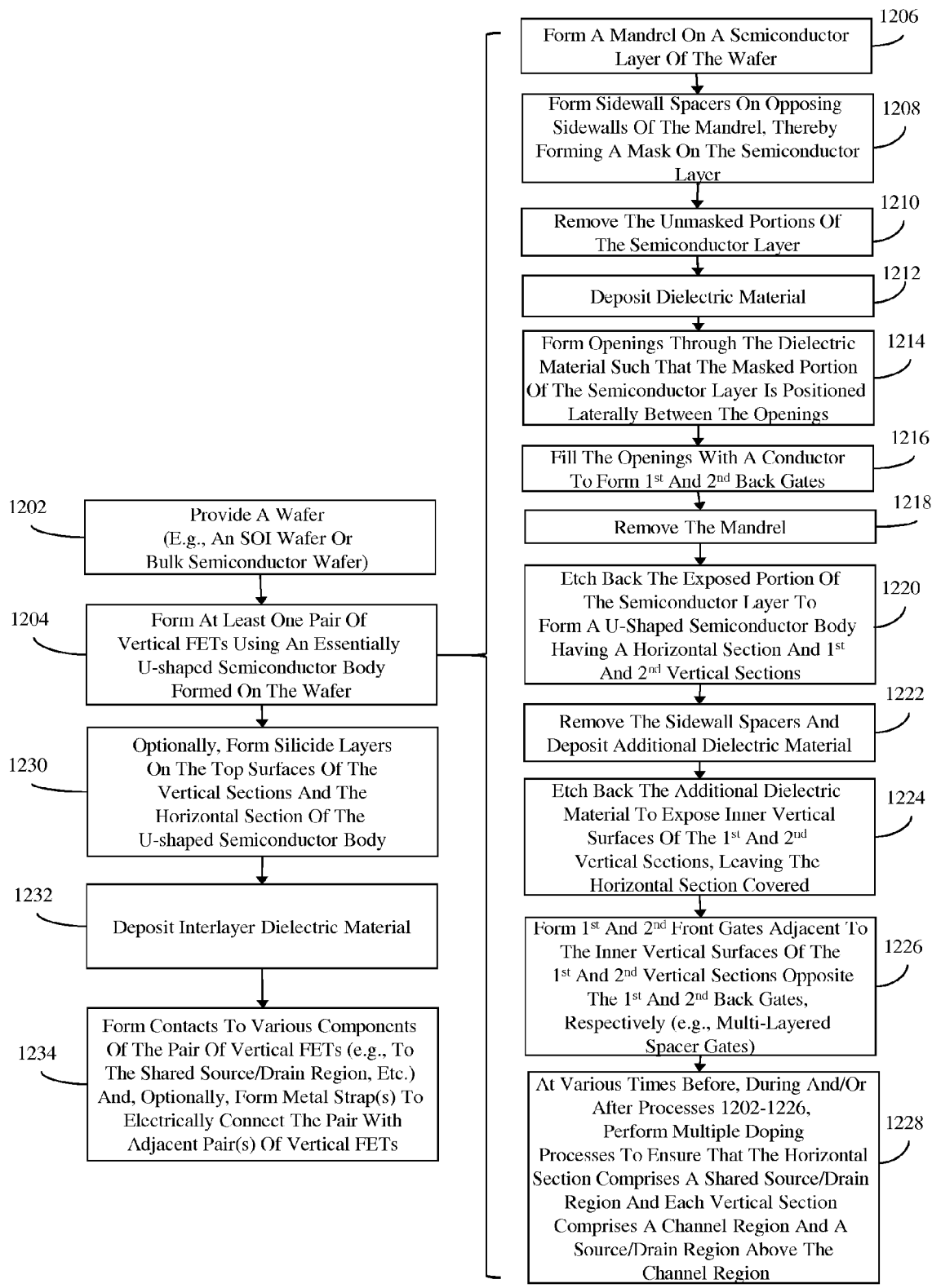
FIG. 12 is a flow diagram illustrating a method of forming the semiconductor structure of FIGS. 2A-2B.
Figure 13:
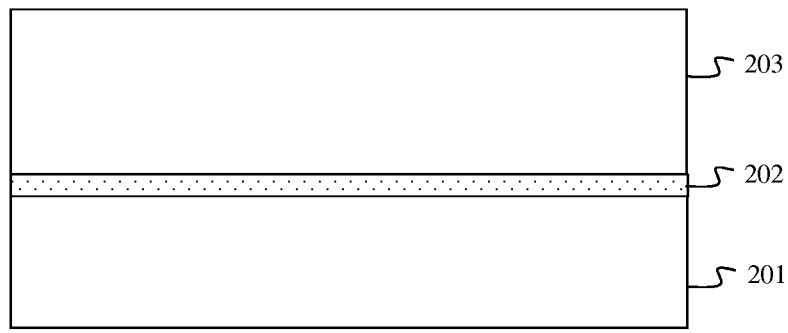
FIG. 13 is a cross-section diagram illustrating a partially completed semiconductor structure formed according to the method of FIG. 12.

For example, referring to FIG. 12, another method disclosed herein similarly comprises providing a wafer (1202). This wafer can comprise, for example, a semiconductor-on-insulator (SOI) wafer comprising a stack of one or more semiconductor layers 203 (see detailed discussion below) immediately adjacent to an insulator layer 202 (e.g., a buried oxide (BOX) layer or other suitable insulator layer) on a semiconductor substrate 201 (e.g., on a silicon substrate or any other suitable semiconductor substrate) (see FIG. 13). Alternatively, the wafer can comprise a bulk semiconductor substrate with a buried well region, which can provide electrically isolation between upper and lower portions of the semiconductor substrate (not shown). For purposes of illustration, the processes required to form the semiconductor structure 200 will be described below and illustrated in the Figures with respect to an SOI wafer.

Figure 14:
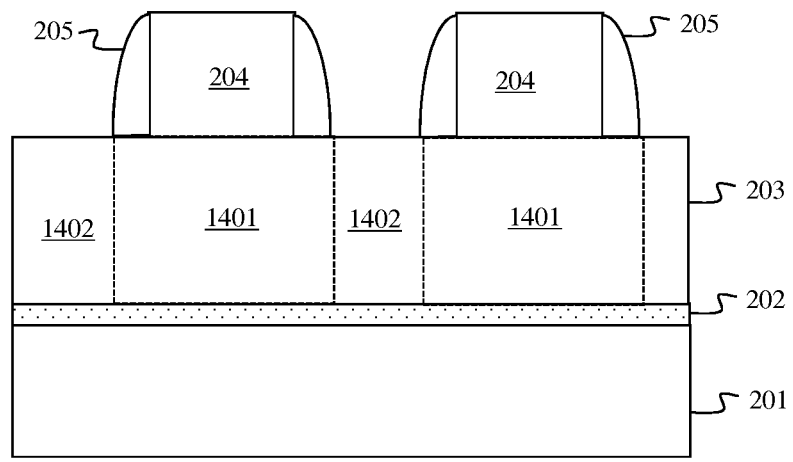
FIG. 14 is a cross-section diagram illustrating a partially completed semiconductor structure formed according to the method of FIG. 12.

The method can further comprise forming at least one pair of vertical field effect transistors on the wafer (1204). For purposes of illustration formation of the pair 261 shown in FIGS. 2A-2B is described; however, it should be understood that one or more additional pairs of vertical field effect transistors (e.g., see pair 262) could simultaneously be formed. To form a pair of vertical field effect transistors, such as the pair 261 in FIGS. 2A-2B, a mandrel 204 can be formed on the semiconductor layer 203 and sidewall spacers 205 can be formed on opposing sidewalls of the mandrel 204 (1206-1208, see FIG. 14). The mandrel 204 can be formed, for example, by depositing a mandrel material layer on the semiconductor layer 203. The mandrel material layer can comprise, for example, a dielectric material, such as silicon dioxide, or any other suitable mandrel material that can be selectively etched over the semiconductor layer 203 below. The mandrel material layer can then be lithographically patterned and etched to form an essentially rectangular-shaped body (referred to herein as a mandrel) above the semiconductor layer 203. Next, sidewall spacers 205 can be formed on the opposing sidewalls of the mandrel 204 using conventional sidewall spacer formation techniques. The sidewall spacers 205 can comprise, for example, another dielectric material, such as silicon nitride, or any other suitable spacer material that can be selectively etched over the semiconductor layer 203 below. It should be noted that the spacer material should specifically be selected so that the mandrel 204 can also be selectively etched over the sidewall spacers 205. As a result of processes 1206-1208, the semiconductor layer 203 will have a masked portion 1401, which is aligned below the mandrel 204 and the sidewall spacers 205 and which is positioned laterally between unmasked portions 1402.

Figure 15:
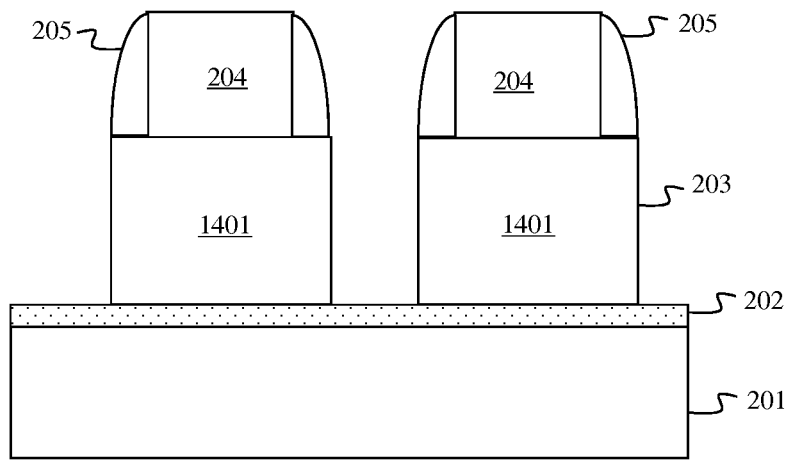
FIG. 15 is a cross-section diagram illustrating a partially completed semiconductor structure formed according to the method of FIG. 12.
Figure 16:
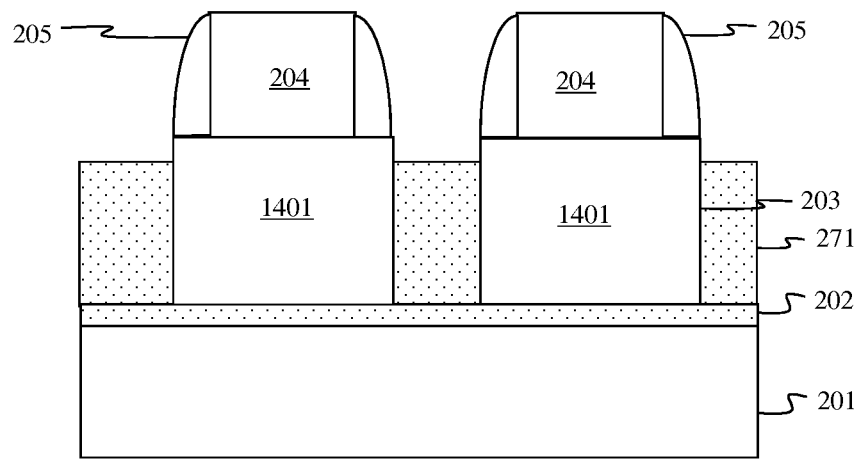
FIG. 16 is a cross-section diagram illustrating a partially completed semiconductor structure formed according to the method of FIG. 12.
Figure 17:
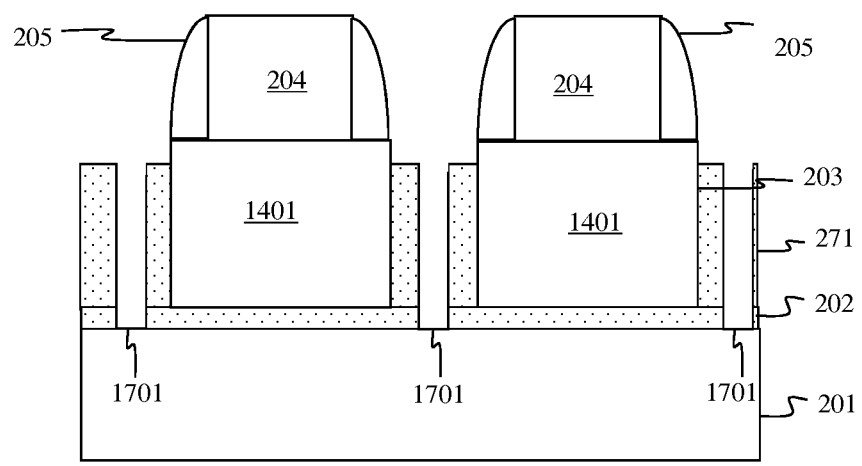
FIG. 17 is a cross-section diagram illustrating a partially completed semiconductor structure formed according to the method of FIG. 12.
Figure 18:
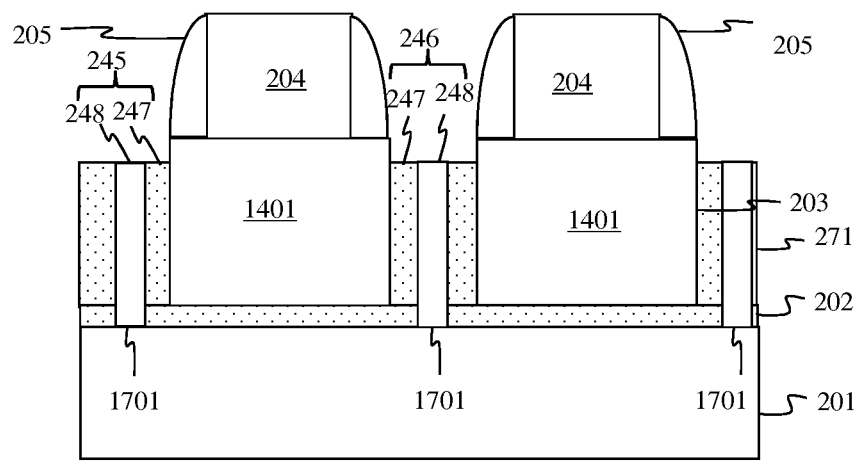
FIG. 18 is a cross-section diagram illustrating a partially completed semiconductor structure formed according to the method of FIG. 12.

Next, the unmasked portions 1402 of the semiconductor layer 203 can be removed (e.g., using an anisotropic reactive ion etch (RIE) process) (1210, see FIG. 15). After the unmasked portions 1402 are removed, one or more layers of dielectric material (e.g., silicon dioxide, silicon nitride, etc.) can be deposited so as to laterally surround the masked portion 1401 (1212, see FIG. 16). After the dielectric material 271 is deposited, openings 1701 can be formed (e.g., lithographically patterned and etched) such that they extend vertically through the dielectric material 271 and the insulator layer 202 and into the semiconductor substrate 201 below and further such that the masked portion 1401 is positioned laterally between the openings 1701 (1214, see FIG. 17). These openings 1701 can then be filled with conductors 248 (also referred to herein as conductive plates) (1216, see FIG. 18). The conductive plates 248 can comprise one or more conductive layers comprising, for example, a metal (e.g., copper, tungsten, aluminum or any other suitable metal), a metal alloy, and/or doped polysilicon. The portions of the dielectric material 271 between each conductive plate 248 and the masked portion 1401 of the semiconductor layer 203 will function as a gate dielectric 247 for first and second back gates 245-246 of the first and second vertical field effect transistors 221-222, respectively, of the pair 261 of vertical field effect transistors.

Figure 19:
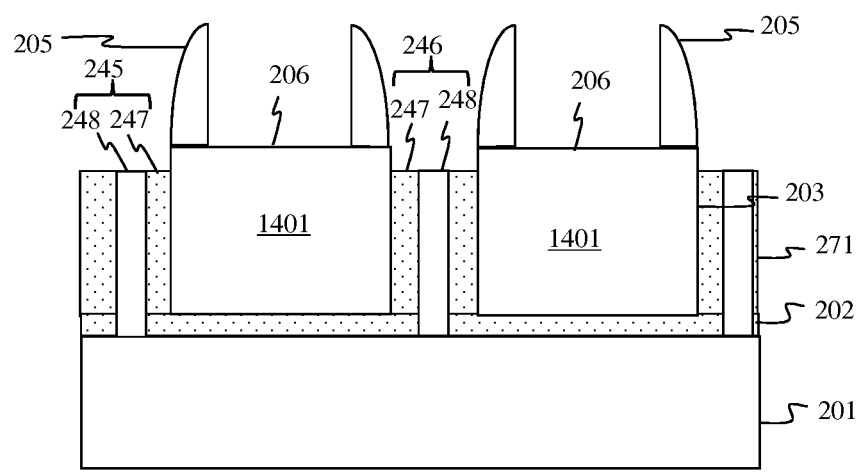
FIG. 19 is a cross-section diagram illustrating a partially completed semiconductor structure formed according to the method of FIG. 12.
Figure 20:
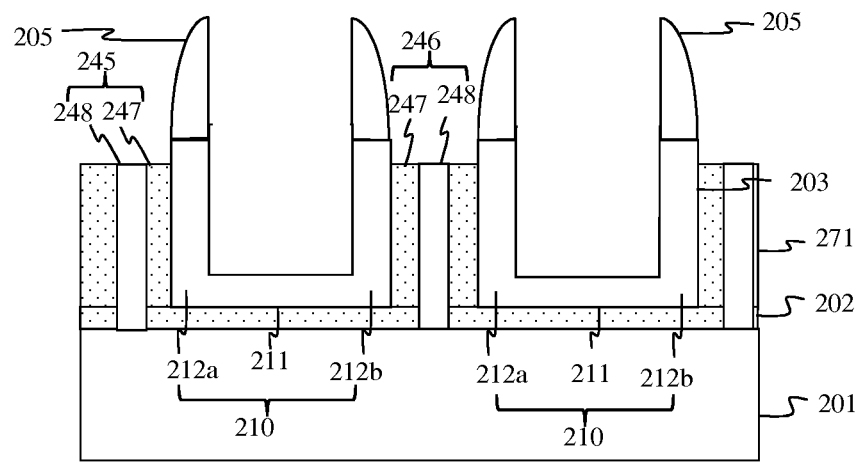
FIG. 20 is a cross-section diagram illustrating a partially completed semiconductor structure formed according to the method of FIG. 12.

Then, the mandrel 204 can be selectively removed (1218, see FIG. 19). Those skilled in the art will recognize that the etch process used to remove the mandrel 204 will depend upon the materials used for the mandrel 204, the sidewall spacers 205 and the semiconductor layer 203. Following removal of the mandrel 204 at process 1218, an exposed portion 206 of the previously masked portion 1401 of the semiconductor layer 203 between the sidewall spacers 205 can be etched back some distance less than the full thickness of the semiconductor layer 203 (e.g., using an anisotropic RIE process), thereby forming a U-shaped semiconductor body 210 with a first vertical section 212a, a second vertical section 212b and a horizontal section 211 between the first vertical section 212a and the second vertical section 212b (1220, see FIG. 20).

As mentioned above, the wafer provided at process 1202 can comprise a stack of one or more semiconductor layers 203 on an insulator layer 202. If the wafer comprises only a single semiconductor layer, the U-shaped semiconductor body 210 will similarly comprise only a single semiconductor layer. However, alternatively, the wafer can comprise multiple different semiconductor layers 203 on the insulator layer 202. In this case, the U-shaped semiconductor body 210 can be formed such the horizontal section 211, the lower portion of the first and second vertical sections 212a-b and/or the upper portion of the first and second vertical sections 212a-b comprise different types of semiconductor materials (e.g., silicon, silicon germanium, silicon germanium carbide, etc.). Those skilled in the art will recognize that different types of semiconductor materials can be used in different components of field effect transistors to tailor strain in the channel region.

Figure 21:
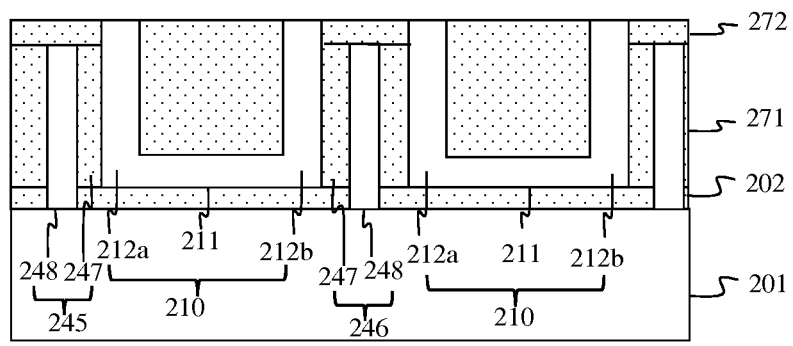
FIG. 21 is a cross-section diagram illustrating a partially completed semiconductor structure formed according to the method of FIG. 12.

After the U-shaped semiconductor body 210 is formed at process 1220, the sidewall spacers 205 can be selectively removed. Those skilled in the art will recognize that the etch process used to remove the sidewall spacers 105 will depend upon the materials used for the sidewall spacers 205, the dielectric materials 271 and the semiconductor layer 203. Next, one or more layers of additional dielectric material 272 (e.g., silicon dioxide, silicon nitride, etc.) can be deposited over the semiconductor body 210 and the first and second back gates 245-246. Following deposition, the additional dielectric material 272 can be planarized to expose the top surfaces of the first and second vertical sections 212a-b of the semiconductor body 210 (1222, see FIG. 21).

Figure 22:
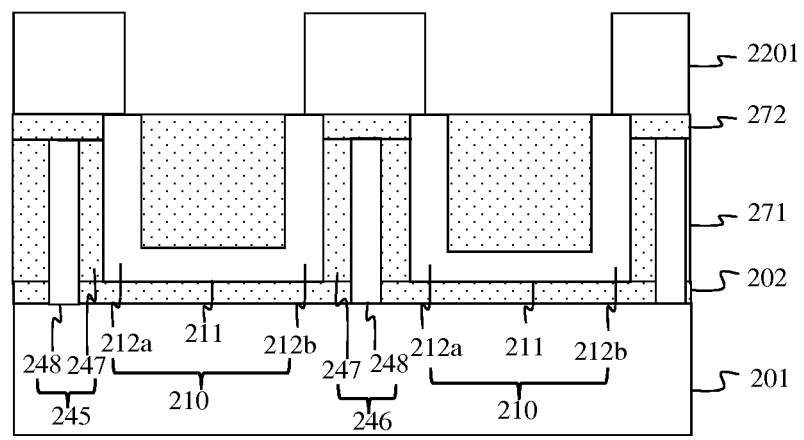
FIG. 22 is a cross-section diagram illustrating a partially completed semiconductor structure formed according to the method of FIG. 12.
Figure 23:
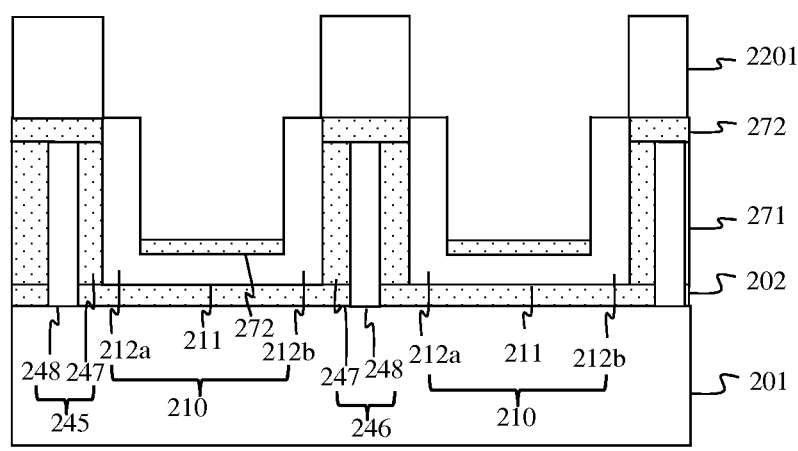
FIG. 23 is a cross-section diagram illustrating a partially completed semiconductor structure formed according to the method of FIG. 12.

Next, a mask layer 2201 (e.g., a photoresist layer) can be formed with openings that expose the additional dielectric material 272 above the horizontal section 211 of the U-shaped semiconductor body (see FIG. 22) and the exposed additional dielectric material 272 can be etched back (e.g., using a buffered hydrofluoric acid (BHF) wet etch process) to expose a first inner vertical surface of the first vertical section 212a and a second inner vertical surface of the second vertical section 212b (1224, see FIG. 23). It should be noted that this process 1224 should be timed so that etching is stopped before the top surface of the horizontal section 211 is exposed. That is, this etch back process 1224 should performed such that the horizontal section 211 between the first vertical section 212a and the second vertical section 212b remains covered by a relatively thin layer of the additional dielectric material 272.

After the additional dielectric material 272 is etched back at process 1224, first and second gates 241-242 can be formed on the thin layer of additional dielectric material 272 above the horizontal section 211 (1226, see FIG. 23). Specifically, a first front gate 241 for the first vertical field effect transistor 221 can be formed adjacent to the exposed first inner vertical surface of the first vertical section 212a opposite the first back gate 245 and a second front gate 242 for the second vertical field effect transistor 222 can be formed adjacent to the exposed second inner vertical surface of the second vertical section 212b opposite the second back gate 246. The first front gate 241 and the second front gate 242 can each be formed so as to comprise, for example, multi-layered spacers. That is, a conformal gate dielectric layer 243 can be deposited such that it is immediately adjacent to the exposed inner vertical surfaces of the first and second vertical sections 212a-b. The gate dielectric layer 243 can comprise, for example, a silicon dioxide layer, a silicon nitride layer, a silicon oxynitride layer, or any other suitable gate dielectric layer including, but not limited to, a high-K gate dielectric layer such as a hafnium (Hf)-based gate dielectric layer (e.g., hafnium oxide, hafnium silicon oxide, hafnium silicon oxynitride, hafnium aluminum oxide, etc.) or some other suitable high-K dielectric material (e.g., aluminum oxide, tantalum oxide, zirconium oxide, etc.). Next, a gate conductor layer 244 can be deposited on the gate dielectric layer 243. The gate conductor layer 244 can comprise, for example, a polysilicon gate conductor layer, a metal gate conductor layer or any other suitable gate conductor layer.

It should be understood that, although a single gate dielectric layer 343 and a single gate conductor layer 244 are illustrated, the gate dielectric layer 243 can comprise a stack of multiple gate dielectric materials and the gate conductor layer 244 can similarly comprise a stack of different gate conductor materials and these different gate conductor materials may vary depending upon the conductivity type of the field effect transistor. For example, for an N-type field effect transistor, the metal gate conductor layer can comprise a stack of metal and/or metal alloys including, but not limited to, at least one metal gate conductor having an N-type work function that is between about 3.9 eV and about 4.2 eV (i.e., an N-type metal gate conductor). Exemplary N-type metal gate conductors can comprise hafnium, zirconium, titanium, tantalum, aluminum, and alloys thereof, such as, hafnium carbide, zirconium carbide, titanium carbide, tantalum carbide, and aluminum carbide. For a P-type field effect transistor, the metal gate conductor layer can comprise a stack of metal and/or metal alloys including, but not limited to, at least one metal gate conductor having a P-type work function that is between about 4.9 eV and about 5.2 eV (i.e., a P-type metal gate conductor). Exemplary P-type metal gate conductors include, for example, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.).

Then, an anisotropic spacer etch process can be performed to remove the gate materials from horizontal surfaces of the semiconductor body 210, thereby creating multi-layered spacers positioned laterally adjacent to the exposed inner vertical surfaces of the first and second vertical sections 212a-b. It should be noted that this spacer etch process should be performed so that the upper portions of the first and second vertical sections 212a-b are also exposed.

Figure 24A:
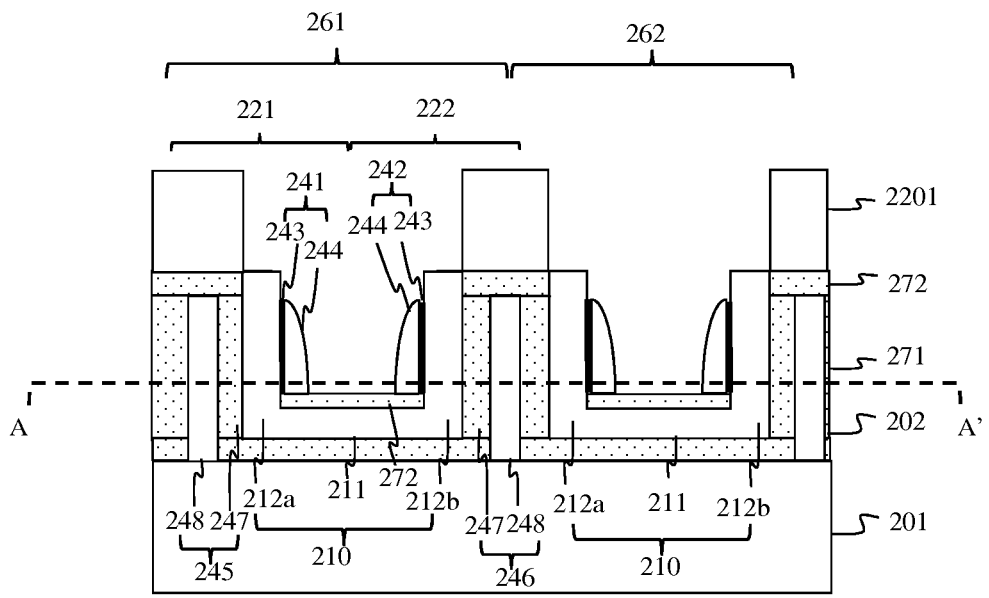
FIG. 24A is a cross-section diagram illustrating a partially completed semiconductor structure formed according to the method of FIG. 12.
Figure 24B:
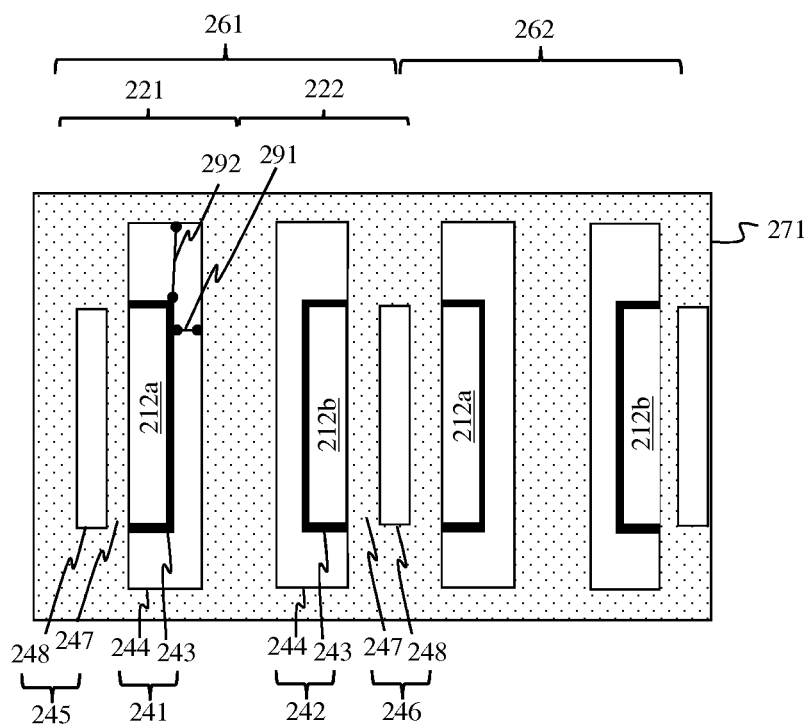
FIG. 24B is a top view diagram illustrating the partially completed semiconductor structure of FIG. 24A; and, FIG. 25 is a cross-section diagram illustrating a partially completed semiconductor structure formed according to the method of FIG. 12.

It should also be noted that when the additional dielectric material 272 is etched back the opposing ends of the vertical sections 212a-b may also be exposed, thereby allowing the front gates 241-242 to wrap around those opposing ends during the multi-layer spacer formation process. In this case, in the resulting structure the first and second front gates 241-242 will be positioned laterally adjacent to three sides of the vertical sections 212a-b. Additionally, if the gate conductor layer 244 of the multi-layered spacers formed as a result of the process steps described above is too narrow to receive a contact, then additional gate conductor deposition and lithographic patterning steps may be required to increase the thickness 292 of the gate conductor layer 244 on one or both of the opposing ends of the first and second vertical sections 212a-b as compared to the thickness 291 of the gate conductor layer 244 on the vertical surfaces of the first and second vertical sections 212a-b opposite the first and second back gates 245-246 (as shown in FIG. 24B).

Figure 25:
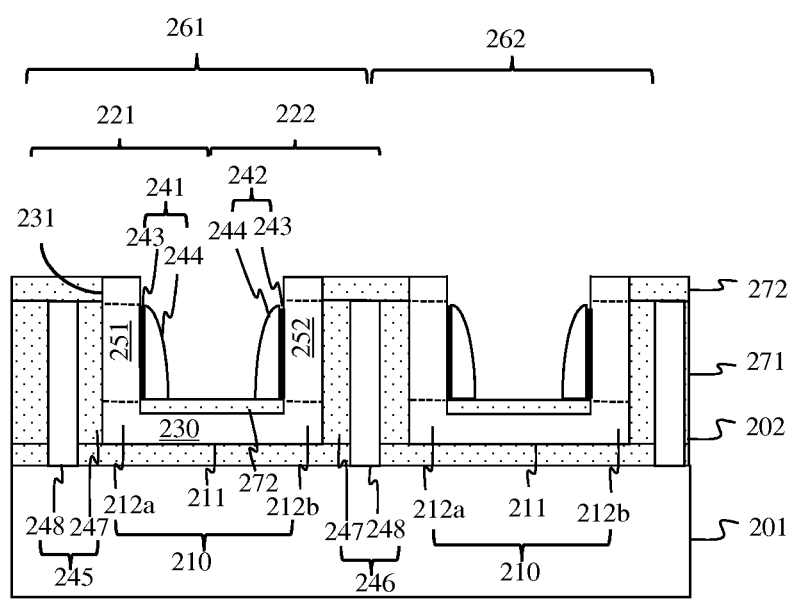

At various times before, during (i.e., in between), and/or after the above-described processes 1202-1226, various doping processes can be performed so that in the resulting semiconductor structure 200 and, particularly, in the resulting U-shaped semiconductor body 210, the horizontal section 211 comprises a shared source/drain region 230 for the pair 261 of vertical field effect transistors, the first vertical section 212a comprises, for the first vertical field effect transistor 221 in the pair 261, a first channel region 251 adjacent to the shared source/drain region 230 in the horizontal section 211 and a first source/drain region 231 above the first channel region 251 and, the second vertical section 212b comprises, for the second vertical field effect transistor 222 in the pair 261, a second channel region 252 adjacent to the shared source/drain region 230 in the horizontal section 211 and a second source/drain region 232 above the second channel region 252 (1228, see FIG. 25). Thus, for example, these doping processes 1228 can be performed such that the lower portion of the first and second vertical sections 212a-b containing the first and second channel regions 251-252, respectively, can have a first type conductivity (e.g., P-type conductivity), whereas the horizontal section 211 containing the shared source/drain region 230 as well as the upper portions of the first and second vertical sections 212a-b containing the first and second source/drain regions 231-232 can have a second type conductivity (e.g., N-type conductivity) that is different from the first type conductivity. Optionally, additional doping processes may be performed so that the horizontal and/or vertical sections of the U-shaped semiconductor body 210 comprise one or more additional doped regions (not shown) including, but are not limited to, source/drain extension regions and/or halo regions between the first and second channel regions 251-252 and the shared source/drain region 130 and/or between the first and second channel regions 251-252 and the first and second source/drain regions 231-232.

Optionally, an opening can be formed in the thin layer of additional dielectric material 272 on the horizontal section 211 (e.g., using lithographic patterning and etch techniques) and silicide layers 290 can be formed the exposed top surfaces of the first and second vertical sections 212a-b and the center portion of the horizontal section 211 (1230, see FIGS. 2A-2B). The silicide layer(s) 290 can be formed using conventional processing techniques. For example, a layer of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof can be conformally deposited over the structure and, specifically, onto the exposed semiconductor surfaces. Next, an anneal process can be performed. Any metal remaining present after the anneal process is performed can be selectively removed. It should be noted that this process 1230 of forming the silicide layers 290 can, depending upon the thickness of the horizontal section 211, consume the entire center portion of the horizontal section 211 such that the shared source/drain region 230 will be divided into two discrete sections separated by a silicide layer 290 (not shown).

After silicide formation, one or more layers of interlayer dielectric material 273 (e.g., silicon dioxide, silicon nitride, borophosphosilicate glass (BPSG), etc.) can be deposited (1232). Next, multiple contacts 281-283 can be formed that extend vertically through the interlayer dielectric material 273 to the different components of the pair 261 of vertical field effect transistors (1234). Specifically, a shared source/drain region contact 281 can be formed such that it extends vertically through the interlayer dielectric material 273 and further through the thin layer of the additional dielectric material 272 to the center portion of the horizontal section 211 below (i.e., to the shared source/drain region 230). Thus, this shared source/drain region contact 281 will be positioned laterally between and will be electrically isolated from the first and second front gates 241-242. Additional source/drain contacts 282 can be formed that extend vertically through the interlayer dielectric material 273 to the first and second source/drain regions 231-232 at the top of the first and second vertical sections 212a-b of the semiconductor body 210. Gate contacts 283 can be formed that extend vertically through the interlayer dielectric material 273 to the first and second gates 241-242. Various techniques for forming either non-self-aligned contacts (as shown) and/or self-aligned contacts can be used at process 1234 to form the contacts 281-283. Contact formation techniques are well known in the art and, thus, the details are omitted from this specification in order to allow the reader to focus on the salient aspects of the disclosure. Optionally, rather than simply contacting the first and second source/drain regions 231-232, metal strap(s) 284 (i.e., wire(s), local interconnect(s), etc.) can be formed in the interlayer dielectric material 273 at the top of the first and/or second vertical sections 212a-b (e.g., using conventional damascene processing techniques) in order to electrically connect the first and/or second source/drain regions 231-232 of the first and/or second vertical field effect transistors 221-222 in the pair 261 to adjacent pair(s) (e.g., additional pair 162) of vertical field effect transistors.

It should further be noted that in the semiconductor structures and methods described above, the first type conductivity is referred to as being P-type conductivity and the second type conductivity is referred to as being N-type conductivity. However, alternatively, the reverse can be true. That is, the first type conductivity can comprise N-type conductivity and the second type conductivity can comprise P-type conductivity. Those skilled in the art will recognize that different dopants can be used to achieve the different conductivity types and that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having a N-type conductivity is typically doped with silicon (Si). Those skilled in the art will also recognize that different conductivity levels will depend upon the relative concentration levels of the dopants.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are semiconductor structures configured to allow for continued size scaling of field effect transistors and methods of forming the structures. The semiconductor structures each comprise a pair of vertical field effect transistors formed from an essentially U-shaped semiconductor body. This semiconductor body has a horizontal section and first and second vertical sections. The horizontal section can comprise a shared source/drain region for first and second vertical field effect transistors. The first and second vertical sections can each comprise a channel region and a source/drain region above the channel region for the first and second vertical field effect transistors, respectively. In one semiconductor structure, each vertical section has a gate wrapped around the channel region. In another semiconductor structure, each vertical section has a front gate positioned adjacent to the inner vertical surface at the channel region and a back gate positioned adjacent to the outer vertical surface at the channel region. In any case, a contact, which is electrically isolated from the gates, can extend vertically to the shared source/drain region in the horizontal section. Optionally, metal strap(s) can electrically connect the pair of vertical field effect transistors to adjacent pair(s) of vertical field effect transistors. In such semiconductor structures, the contact pitch is not limited by gate length as in prior art MUGFET structures since the gate length is in the vertical direction. Thus, the contact pitch can, for example, be less than 50% of the gate length. Additionally, the fin pitch (i.e., the pitch between the vertical sections of the U-shaped semiconductor body) can larger than the fin pitch in prior art MUFGETs, thereby allowing for good gate fill. Finally, the transistor width is quantized and the thickness of the initial semiconductor layer can be greater than two times the fin height in prior art MUGFETs, thereby improving analog device (e.g., electrostatic discharge device (ESD)) performance.

What is claimed is:

1. A method of forming a semiconductor structure, said method comprising:
    forming a pair of vertical field effect transistors on an insulator layer, said forming of said pair comprising:
        forming an essentially U-shaped monocrystalline semiconductor body comprising:
            a horizontal section immediately adjacent to said insulator layer;
            a first vertical section extending vertically from a first end of said horizontal section and having a first outer vertical surface and a first inner vertical surface opposite said first outer vertical surface; and,
            a second vertical section parallel to said first vertical section and extending vertically from a second end of said horizontal section opposite said first end, said second vertical section having a second inner vertical surface and a second outer vertical surface opposite said second inner vertical surface and said horizontal section having edges at said first end and said second end that are vertically aligned with said first outer vertical section of said first vertical section and said second outer vertical surface of said second vertical section;
        depositing dielectric material over said monocrystalline semiconductor body and said insulator layer;
        etching back said dielectric material to expose said first vertical section and said second vertical section, said etching back being performed such that said horizontal section between said first vertical section and said second vertical section remains covered by a first portion of said dielectric material and such that a second portion of said dielectric material that is thicker than said first portion remains above said insulator layer positioned laterally adjacent to said edges; and,
        after said etching back, forming, above said dielectric material, a first gate adjacent to said first vertical section and a second gate adjacent to said second vertical section; and,
    forming a contact positioned laterally between and electrically isolated from said first gate and said second gate, said contact extending vertically to a center portion of said horizontal section.

2. The method of claim 1, said forming of said pair further comprising: performing doping processes so that said horizontal section comprises a shared source/drain region for said pair of vertical field effect transistors, so that said first vertical section comprises, for a first vertical field effect transistor of said pair, a first channel region and a first source/drain region above said first channel region such that said first channel region is stacked vertically between said first end of said horizontal section and said first source/drain region, and so that said second vertical section comprises, for a second vertical field effect transistor of said pair, a second channel region and a second source/drain region above said second channel region such that said second channel region is stacked vertically between said second end of said horizontal section and said second source/drain region.

3. The method of claim 1, said first gate and said second gate being formed so as to wrap around said first vertical section and said second vertical section, respectively.

4. The method of claim 1, said first gate and said second gate each being formed so as to comprise a multi-layered spacer comprising a gate dielectric layer and a gate conductor layer positioned laterally adjacent to said gate dielectric layer.

5. The method of claim 1, further comprising, before said forming of said contact, forming silicide layers on top surfaces of said first vertical section, said second vertical section and said center portion of said horizontal section.

6. The method of claim 1, said forming of said monocrystalline semiconductor body comprising:
    forming a mandrel on a monocrystalline semiconductor layer and sidewall spacers on opposing sidewalls of said mandrel such that said monocrystalline semiconductor layer has unmasked portions and a masked portion positioned laterally between said unmasked portions, said masked portion being aligned below said mandrel and said sidewall spacers;
    removing said unmasked portions;
    removing said mandrel; and,
    etching back an exposed portion of said monocrystalline semiconductor layer between said sidewall spacers to form said first vertical section, said second vertical section and said horizontal section between said first vertical section and said second vertical section.

7. The method of claim 1, further comprising: during said forming of said pair, forming an additional pair of vertical field effect transistors positioned laterally adjacent to said pair; and forming a metal strap electrically connecting said pair and said additional pair.

8. A method of forming a semiconductor structure, said method comprising:
    forming a pair of vertical field effect transistors on an insulator layer, said forming of said pair comprising:
        forming an essentially U-shaped monocrystalline semiconductor body comprising:
            a horizontal section immediately adjacent to said insulator layer;
            a first vertical section extending vertically from a first end of said horizontal section and having a first outer vertical surface and a first inner vertical surface opposite said outer vertical surface; and, a second vertical section parallel to said first vertical section and extending vertically from a second end of said horizontal section opposite said first end, said second vertical section having a second inner vertical surface and a second outer vertical surface opposite said second inner vertical surface and said horizontal section having edges at said first end and said second end that are vertically aligned with said first outer vertical section of said first vertical section and said second outer vertical surface of said second vertical section;

depositing dielectric material over said monocrystalline semiconductor body and said insulator layer;

planarizing said dielectric material to expose top surfaces of said first vertical section and said second vertical section;

etching back said dielectric material to expose said first vertical section and said second vertical section, said etching back being performed such that said horizontal section between said first vertical section and said second vertical section remains covered by a first portion of said dielectric material and such that a second portion of said dielectric material that is thicker than said first portion remains above said insulator layer positioned laterally adjacent to said edges;

after said etching back, forming a first gate on said dielectric material positioned laterally adjacent to said first vertical section and a second gate on said dielectric material and positioned laterally adjacent to said second vertical section; and, performing various doping processes during said forming of said pair so that said horizontal section comprises a shared source/drain region for said pair, so that said first vertical section comprises, for a first vertical field effect transistor of said pair, a first channel region and a first source/drain region above said first channel region such that said first channel region is stacked vertically between said first end of said horizontal section and said first source/drain region, and so that said second vertical section comprises, for a second vertical field effect transistor of said pair, a second channel region and a second source/drain region above said second channel region such that said second channel region is stacked vertically between said second end of said horizontal section and said second source/drain region;

depositing interlayer dielectric material over said pair; and, forming a contact positioned laterally between and electrically isolated from said first gate and said second gate, said contact extending vertically through said interlayer dielectric material to a center portion of said horizontal section.

9. The method of claim 8, said first gate and said second gate being formed so as to wrap entirely around lower portions of said first vertical section and said second vertical section, respectively.

10. The method of claim 8, said first gate and said second gate each being formed so as to comprise a multi-layered spacer comprising a gate dielectric layer and a gate conductor layer positioned laterally adjacent to said gate dielectric layer.

11. The method of claim 8, further comprising, before said forming of said contact, forming silicide layers on top surfaces of said first vertical section, said second vertical section and said center portion of said horizontal section.

12. The method of claim 8, said forming of said monocrystalline semiconductor body comprising:

forming a mandrel on a monocrystalline semiconductor layer and sidewall spacers on opposing sidewalls of said mandrel such that said monocrystalline semiconductor layer has unmasked portions and a masked portion positioned laterally between said unmasked portions, said masked portion being aligned below said mandrel and said sidewall spacers;

removing said unmasked portions;

removing said mandrel; and, etching back an exposed portion of said monocrystalline semiconductor layer between said sidewall spacers to form said first vertical section, said second vertical section and said horizontal section between said first vertical section and said second vertical section.

13. The method of claim 8, further comprising: during said forming of said pair, forming an additional pair of vertical field effect transistors positioned laterally adjacent to said pair; and forming a metal strap electrically connecting said pair and said additional pair.

14. The method of claim 8, said first gate being formed so as to comprise a first gate conductor layer with a first thickness on first opposing sides of said first vertical section and with a second thickness that is greater than said first thickness on first opposing ends of said first vertical section, and said second gate being formed so as to comprise a second gate conductor layer with said first thickness on second opposing sides of said second vertical section and with said second thickness on second opposing ends of said second vertical section.

15. A method of forming a semiconductor structure, said method comprising:

forming a pair of vertical field effect transistors on an insulator layer, said forming of said pair comprising:

forming a mandrel on a monocrystalline semiconductor layer above said insulator layer and sidewall spacers on opposing sidewalls of said mandrel such that said monocrystalline semiconductor layer has unmasked portions and a masked portion positioned laterally between said unmasked portions, said masked portion being aligned below said mandrel and said sidewall spacers;

removing said unmasked portions;

depositing dielectric material;

forming openings in said dielectric material such that said masked portion is positioned laterally between said openings;

filling said openings with a conductor such that said masked portion is positioned laterally between a first back gate and a second back gate;

removing said mandrel;

etching back an exposed portion of said monocrystalline semiconductor layer between said sidewall spacers to form an essentially U-shaped monocrystalline semiconductor body comprising:

a horizontal section;

a first vertical section extending vertically from a first end of said horizontal section and having a first outer vertical surface and a first inner vertical surface opposite said first outer vertical surface; and, a second vertical section parallel to said first vertical section, extending vertically from a second end of said horizontal section opposite said first end, and having a second outer vertical surface and a second inner vertical surface opposite said second outer vertical surface, said horizontal section having edges that are vertically aligned with said first outer vertical surface of said first vertical section and said second outer vertical surface of said second vertical section;

removing said sidewall spacers and depositing additional dielectric material so as to fill a space above said horizontal section between said first inner vertical surface of said first vertical section and said second inner vertical surface of said second vertical section;

etching back said additional dielectric material between said first vertical section and said second vertical section to expose said first inner vertical surface of said first vertical section and said second inner vertical surface of said second vertical section, said etching back being performed such that a remaining portion of said additional dielectric material covers said horizontal section between said first inner vertical section and said second inner vertical section; and, after said etching back of said additional dielectric material, forming, above said remaining portion of said additional dielectric material, a first front gate adjacent to said first inner vertical surface opposite said first back gate and a second front gate adjacent to said second inner vertical surface opposite said second back gate;

depositing interlayer dielectric material over said pair; and, forming a contact positioned laterally between and electrically isolated from said first front gate and said second front gate, said contact extending vertically through said interlayer dielectric material to a center portion of said horizontal section.

16. The method of claim 15, said forming of said pair further comprising performing doping processes so that said horizontal section comprises a shared source/drain region for said pair of vertical field effect transistors, so that said first vertical section comprises, for a first vertical field effect transistor of said pair, a first channel region and a first source/drain region above said first channel region such that said first channel region is stacked vertically between said first end of said horizontal section and said first source/drain region, and so that said second vertical section comprises, for a second vertical field effect transistor of said pair, a second channel region and a second source/drain region above said second channel region such that said second channel region is stacked vertically between said second end of said horizontal section and said second source/drain region.

17. The method of claim 15, said first front gate and said second front gate each being formed so as to comprise a multi-layered spacer comprising a gate dielectric layer and a gate conductor layer positioned laterally adjacent to said gate dielectric layer.

18. The method of claim 15, further comprising, before said forming of said contact, forming silicide layers on top surfaces of said first vertical section, said second vertical section and said center portion of said horizontal section.

19. The method of claim 15, further comprising: during said forming of said pair, forming an additional pair of vertical field effect transistors positioned laterally adjacent to said pair; and forming a metal strap electrically connecting said pair to said additional pair.

20. The method of claim 15, said forming of said openings comprising etching said openings through said additional dielectric material, through said insulator layer and into a semiconductor substrate below said insulator layer.

* * * * *